(12) United States Patent
Weber et al.

(10) Patent No.: US 11,728,790 B2
(45) Date of Patent: *Aug. 15, 2023

(54) ELECTRONIC CIRCUIT HAVING A TRANSISTOR DEVICE AND A BIASING CIRCUIT

(71) Applicant: Infineon Technologies Austria AG, Villach (AT)

(72) Inventors: Hans Weber, Bayerisch Gmain (DE); Franz Hirler, Isen (DE); Matteo-Alessandro Kutschak, Ludmannsdorf (AT); Andreas Riegler, Lichtpold (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 17/712,782

(22) Filed: Apr. 4, 2022

(65) Prior Publication Data
US 2022/0231671 A1  Jul. 21, 2022

Related U.S. Application Data

(63) Continuation of application No. 17/193,490, filed on Mar. 5, 2021, now Pat. No. 11,323,099.

(30) Foreign Application Priority Data

Sep. 7, 2020 (EP) .................................... 20194874
Sep. 28, 2020 (EP) .................................... 20198781

(51) Int. Cl.
*H03K 19/017* (2006.01)
*H03K 17/687* (2006.01)
*H02M 1/38* (2007.01)
*H02M 3/07* (2006.01)
*H03K 3/012* (2006.01)
*H02M 3/335* (2006.01)
*H01L 29/16* (2006.01)
(Continued)

(52) U.S. Cl.
CPC .......... *H03K 3/012* (2013.01); *H01L 29/1608* (2013.01); *H02M 1/082* (2013.01); *H02M 3/33571* (2021.05); *H03K 17/18* (2013.01); *H03K 17/687* (2013.01)

(58) Field of Classification Search
None
See application file for complete search history.

(56) References Cited

U.S. PATENT DOCUMENTS 6,856,177 B1    2/2005  De et al.
9,917,584 B2    3/2018  Gong et al.
11,323,099 B2 * 5/2022  Weber .................... H03K 17/74
(Continued)

*Primary Examiner* — Kenneth B Wells
(74) *Attorney, Agent, or Firm* — Murphy, Bilak & Homiller, PLLC

(57) ABSTRACT

Electronic circuits are disclosed. One electronic circuit includes: a transistor device having a load path and a drive input; a first drive circuit configured to receive a supply voltage and generate a drive signal for the transistor device based on the supply voltage; and a biasing circuit connected in parallel with the load path of the transistor device. The biasing circuit includes a bias voltage circuit configured to receive the supply voltage and generate a bias voltage higher than the supply voltage based on the supply voltage.

25 Claims, 13 Drawing Sheets

(51) Int. Cl.
*H02M 1/08* (2006.01)
*H03K 17/18* (2006.01)

(56) References Cited

U.S. PATENT DOCUMENTS

2014/0063882 A1 3/2014 Hirler et al.
2015/0179633 A1 6/2015 Mauder et al.

\* cited by examiner

A-A

ELECTRONIC CIRCUIT HAVING A TRANSISTOR DEVICE AND A BIASING CIRCUIT

TECHNICAL FIELD

This disclosure relates in general to an electronic circuit with a transistor device, in particular a transistor device including an internal diode, and a biasing circuit.

BACKGROUND

Some types of transistor devices, such as MOSFETs (Metal Oxide Semiconductor Field-Effect Transistor) include an internal diode, which is often referred to as body diode, between a first load node (drain node) and a second load node (source node) of the transistor. In many types of electronic circuits MOSFETs are operated in such a way that the respective body diode is forward biased for a certain time period, so as to conduct a current.

Forward biasing the body diode is associated with the generation of a charge carrier plasma that includes first type and second type (p and n) charge carriers inside the body diode. When the body diode is reverse biased, so that the body diode blocks, this charge carrier plasma is removed and an output capacitance of the transistor device is charged. Removing the charge carrier plasma and charging the output capacitance is associated with a current, which may also be referred to as charging current. This charging current is associated with losses, which are sometimes referred to as reverse recovery losses. Basically, the higher the voltage across a current path in which the charging current flows, the higher the losses associated with removing the charge carrier plasma from the body diode and the charging the output capacitance.

SUMMARY

There is a need to reduce losses in an electronic circuit that includes a transistor device, in particular a superjunction transistor device.

One example relates to an electronic circuit. The electronic circuit includes a transistor device having a load path and a drive input, a first drive circuit configured to receive a supply voltage and generate a drive signal for the transistor device based on the supply voltage, and a biasing circuit connected in parallel with the load path of the transistor device. The biasing circuit includes a bias voltage circuit is configured to receive the supply voltage and generate a bias voltage higher than the supply voltage based on the supply voltage.

Another example relates to an electronic circuit. The electronic circuit includes a transistor device having a load path and a drive input, and a biasing circuit connected in parallel with the load path of the transistor device. The biasing circuit is configured to connect a bias voltage circuit providing a bias voltage to the load path of the transistor device, and the biasing circuit includes at least one inductor.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
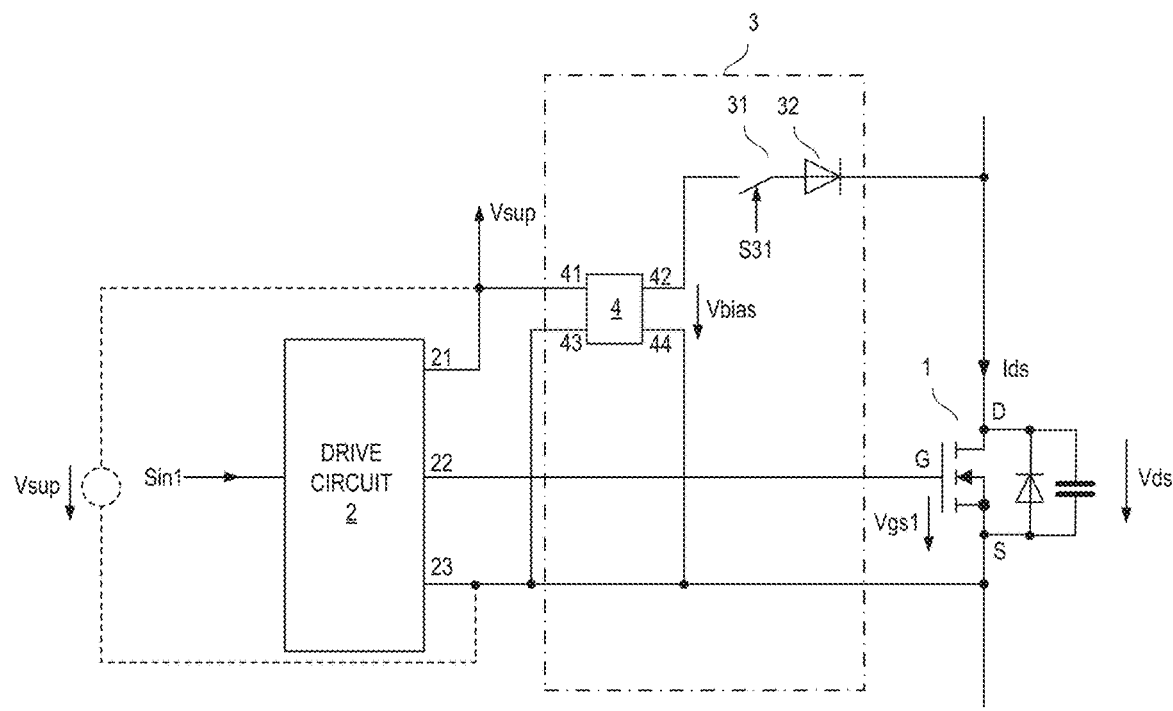
FIG. 1 shows a circuit diagram of an electronic circuit with a transistor device, a drive circuit configured to receive supply voltage, and a biasing circuit configured to apply a bias voltage to a load path of the superjunction transistor device.

FIG. 1 shows one example of an electronic circuit that includes a transistor device 1, a drive circuit 2 configured to drive the transistor device 1, and a biasing circuit 3. The transistor device 1 includes a drive input that is configured to receive a drive voltage Vgs1 and a load path D-S between a first load node D and a second load node S. In the example illustrated in FIG. 1, the drive input configured to receive the drive voltage Vgs1 includes a control node G and the second load node S. This, however, is only an example. According to another example (not illustrated) the drive input may include the control node G and a further control node (which is sometimes referred to as Kelvin source).

According to one example, the transistor device is a MOSFET. In this case, the first load node D is a drain node, the second load node S is a source node, and the control node G is a gate node of the MOSFET. The drive input may be formed by the gate node G and the source node S. In the following, although the transistor device 1 is not restricted to be implemented as a MOSFET, the terms drain node D, source node S, and gate node G will be used to denote the first and second load nodes and the control node, respectively, of the transistor device 1.

The transistor device includes an internal diode (which is also referred to as body diode in the following) between the drain node D and the source node S of the transistor device. For the purpose of illustration in FIG. 1, this internal diode is represented by the circuit symbol of a diode connected between the drain node D and the source node S of the transistor device 1. Furthermore, the transistor device includes an internal output capacitance, which includes a capacitance between the drain node D and the source node S (which is usually referred to as drain-source capacitance) and a capacitance between the gate node G and the drain node D (which is usually be referred to as gate-drain capacitance). This output capacitance is represented by the circuit symbol of a capacitor connected between the drain node D and the source node S of the transistor device 1 (for the ease of illustration, this capacitor symbol is omitted in the remainder of the drawings).

The transistor device 1 can be operated in different operating states, wherein these operating states are dependent on a voltage level of the drive voltage Vgs1 and a polarity of a load path voltage (drain-source voltage) Vds, which is a voltage between the drain node D and the source node S.

(a) The transistor device is in an on-state when the drive voltage Vgs1 has an on-level. An n-type MOSFET, for example, is in the on-state when the drive voltage Vgs1 is positive and higher than a threshold voltage. In the on-state, the transistor device 1 is configured to conduct a current between the drain node D and the source node S irrespective of a polarity of the load path voltage Vds. In the on-state, a load current Ids flows in a first direction when the load path voltage Vds has a first polarity and flows in a second direction opposite the first direction when the load path voltage Vds has a second polarity opposite the first polarity.

(b) The transistor device is in an off-state when the drive voltage Vgs1 has an off-level. An n-type transistor device, for example, is in the off-state when the drive voltage Vgs1 is below a respective threshold voltage of the transistor device. In the off-state, the transistor device 1 blocks when the load path voltage Vds has a first polarity, which is a polarity that reverse biases the internal body diode.

(c) The transistor device 1 conducts a current when the drive voltage Vgs1 has an off-level and when the load path voltage Vds has a second polarity, which is a polarity that forward biases the internal body diode. This operating state is also referred to as reverse conducting state of the transistor device 1 in the following.

An operating state of the transistor device in which the drain-source voltage has a polarity that reverse biases the body diode is referred to as forwarding biased state of the transistor device 1. In the forward biased state, the transistor device 1 (i) conducts a current when the transistor device is in the on-state, wherein this operating state is also referred to as forward conducting state; or (ii) blocks when the transistor device is in the off-state, wherein this operating state is referred to as forward blocking state in the following. The output capacitance of the transistor 1 is charged when the transistor device is in the forward blocking state and the drain-source voltage Vds increases.

In the electronic circuit illustrated in FIG. 1, the drive voltage Vgs1 is generated by the drive circuit 2 based on a supply voltage Vsup received by the drive circuit 2 and dependent on an input signal Sin1. According to one example, the drive circuit 2 is configured to generate the drive voltage Vgs1 such that the drive voltage Vgs1 essentially equals the supply voltage Vsup, so that the transistor device 1 switches on, when the input signal Sin1 indicates that it is desired to switch on the transistor device 1. Furthermore, the drive circuit is configured to generate the drive voltage Vgs1 such that the drive voltage Vgs1 and is essentially zero, so that the transistor device 1 switches off, when the input signal Sin1 indicates that it is desired to switch off the transistor device 1.

According to one example, the drive circuit 2 receives the supply voltage Vsup between a first supply node 21 and a second supply node 23, wherein the second supply node 23 is also referred to as drive circuit ground node (or briefly as ground node) in the following. Further, the drive circuit 2 provides the drive voltage Vgs1 at an output node 22. According to one example, the supply voltage Vsup and the drive voltage Vgs1 are both referenced to the ground node 23, so that the drive voltage Vgs1 is available between the output node 22 and the ground node 23 of the drive circuit 2.

According to one example, the supply voltage Vsup is between 10 V and 15 V, in particular between 11 V and 14 V.

This biasing circuit 3 is connected in parallel with the load path D-S of the transistor device 1 and is configured to apply a bias voltage Vbias to the load path D-S of the transistor device 1. In the example illustrated in FIG. 1, the biasing circuit 3 includes a bias voltage circuit 4 that provides the bias voltage Vbias, an electronic switch 31, and a rectifier element 32. The bias voltage circuit 4 provides the bias voltage Vbias at an output 42, 44. The output 42, 44 of the bias voltage circuit 4, the electronic switch 31 and the rectifier element 32 are connected in series, wherein the bias voltage Vbias is applied to the load path D-S of the transistor device 1 when the electronic switch 31 is switched on. The electronic switch 31 switches on or off dependent on a drive signal S31 received at an input of the electronic switch 31. An example for driving this electronic switch 31 is explained in detail herein further below.

According to one example, the rectifier element 3 is a diode. According to one example, the diode is a silicon carbide (SiC) based diode. The transistor device is a silicon-based transistor device, for example.

A polarity of the bias voltage Vbias is such that the bias voltage Vbias reverse biases the body diode of the transistor device 1 and charges the output capacitance when the transistor device 1 is in the off-state. Applying the bias voltage Vbias to the load path D-S of the transistor device 1 has the effect that a charge carrier plasma is removed from the transistor device 1, when before applying the bias voltage Vbias the body diode was forward biased. Moreover, applying the bias voltage Vbias has the effect that output capacitance of the transistor device 1 between the drain node D and the source node S is charged. This is explained in detail herein further below.

According to one example, as illustrated in FIG. 1, the bias voltage Vbias is based on the supply voltage Vsup. That is, the bias voltage circuit 4 receives the supply voltage Vsup at an input 41, 43 and generates the bias voltage Vbias based on the supply voltage Vsup at the output 42, 44. Examples of the bias voltage source 4 are explained herein further below.

By using the supply voltage Vsup to generate the bias voltage Vbias only one external voltage source for both driving the transistor device 1 and biasing the load path D-S of the transistor device 1 is required.

Figure 2:
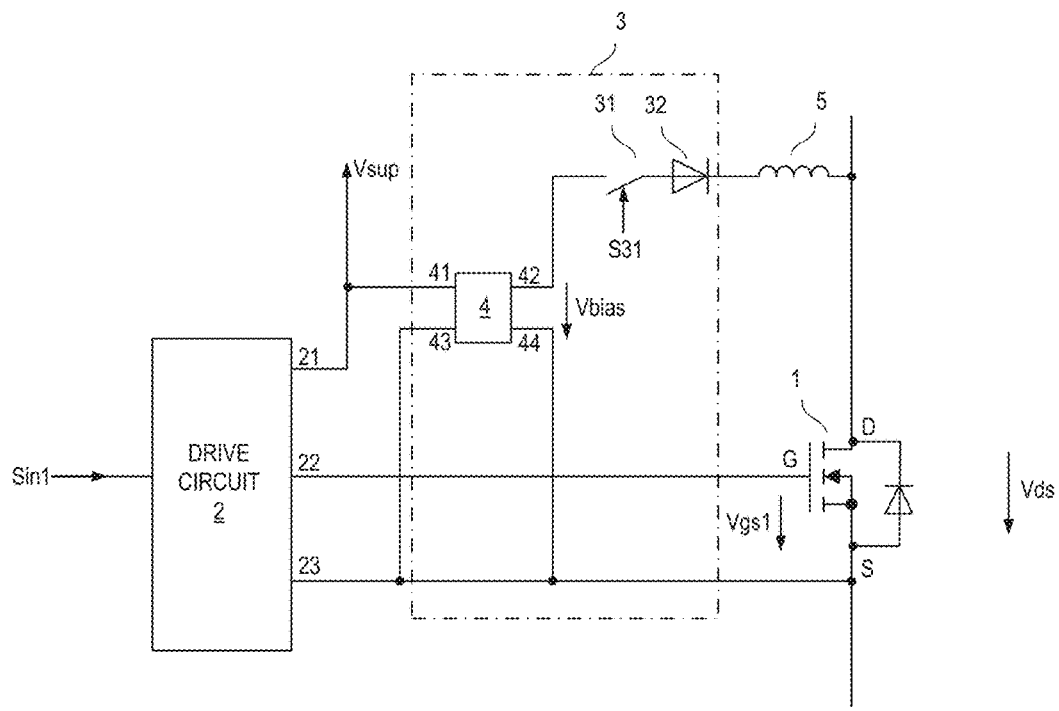
FIGS. 2 and 3 show electronic circuits of the type shown in FIG. 1 that include one or more inductors.
Figure 3:
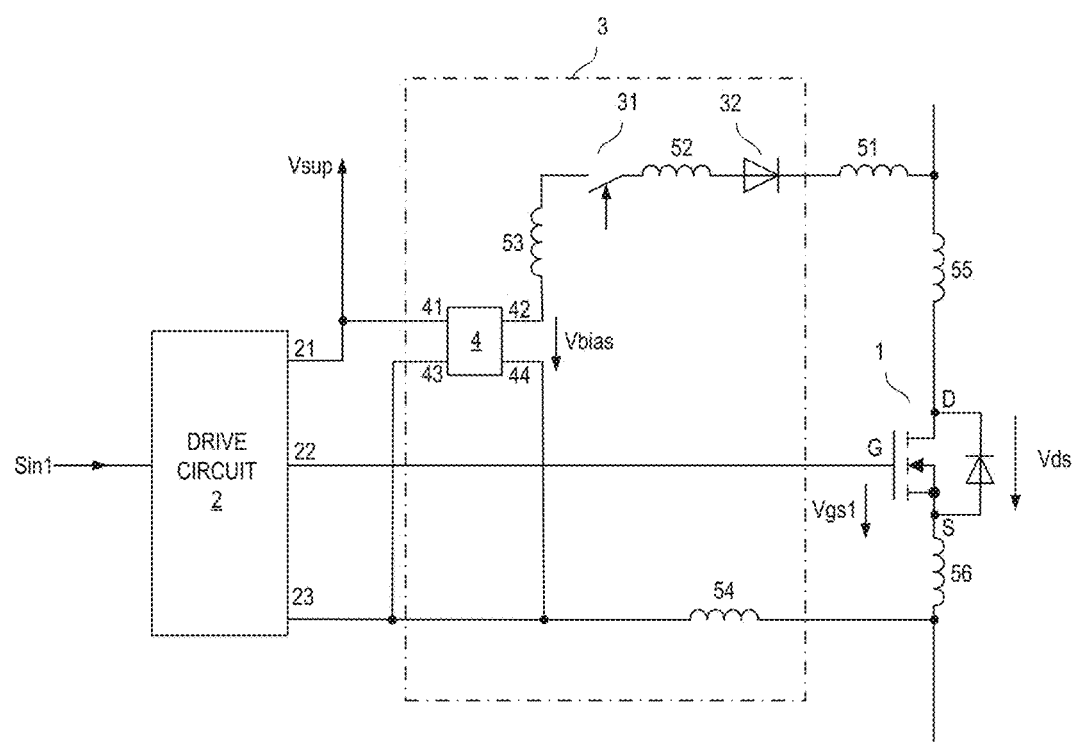
Figure 5:
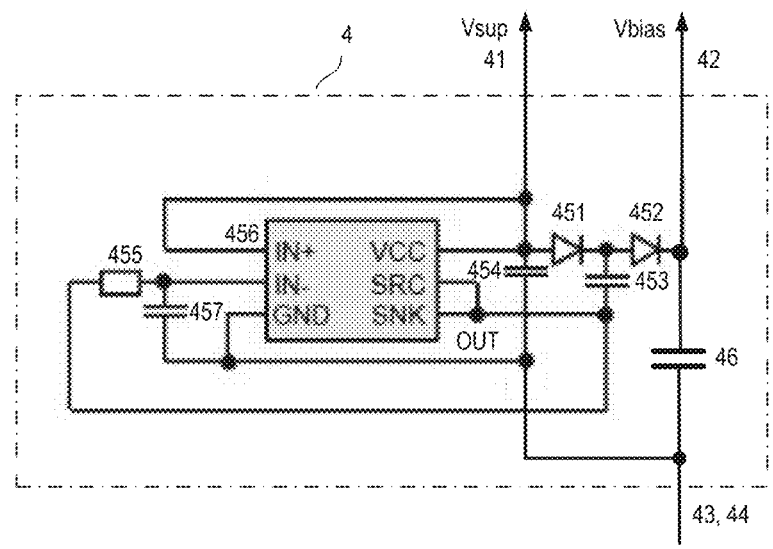
FIG. 5 shows one example of a bias voltage source configured to generate a bias voltage higher than the supply voltage based on the supply voltage.

Referring to FIGS. 2 and 3, a circuit path that includes the load path D-S of the transistor device 1 and the biasing circuit 3 includes at least one inductor that is connected in series with the load path D-S of the transistor device 1, the rectifier element 32, and the electronic switch 31. The at least one inductor may include one inductor 5 in the biasing circuit 3, as illustrated in FIG. 5. According to another example, the at least one inductor includes several inductors 51-56 at different positions of the circuit path including the biasing circuit 3 and the load path D-S of the transistor device 1. The at least one inductor 5, 51-56 can be implemented as a discrete device added to the circuit path. Alternatively, the at least one inductor can be formed by wires that connect the individual devices in the biasing circuit 3 and/or that connect the biasing circuit 3 to the drain and source node D, S of the transistor device 1. The wires may be implemented in such a way that the circuit path of the biasing circuit 3 and the transistor device 1 includes a desired inductance. According to one example, the inductance provided by the at least one inductor 5, 51-56 is between 5 nanohenries (nH) and 30 nH, in particular between 10 nH and 20 nH.

The at least one inductor 5, 51-56 has a boost effect in such a way that after switching on the electronic switch 31 the load path voltage Vds of the transistor device 1 may increase to a voltage level that is higher than a voltage level of the bias voltage Vbias. This is explained in the following.

When the electronic switch 31 switches on and the bias voltage Vbias is applied between the drain node D and the source node S of the transistor device 1 the output capacitance of the transistor device 1 is charged to a certain extent. Charging the output capacitance is associated with a charging current, wherein this charging current decreases as the output capacitance charges and the load path voltage Vds of the transistor device 1 increases. The at least one inductor 5, 51-56, however, counteracts such decrease of the charging current by increasing the load path voltage Vds to a voltage level higher than the bias voltage Vbias. This has the effect that the output capacitance of the transistor device 1 is charged further.

According to one example, the inductance of the at least one inductor 5, 51-56 is selected such that the voltage level the load path voltage Vds reaches, after switching on the electronic switch 31, is at least to 1.2 times, at least 1.5 times, at least 2 times, or at least 3 times the voltage level of the bias voltage Vbias. In the example in which the bias voltage Vbias equals the supply voltage Vsup, the at least one inductor 5, 51-56 has the effect that the voltage Vds applied to the load path D-S is at least 1.2 times, at least 1.5 times, at least 2 times, or at least 3 times the voltage level of the supply voltage Vbias.

It should be noted that in a MOSFET, such as a superjunction MOSFET, the output capacitance is highly non-linear and is dependent on the voltage level of the load path voltage Vds that is applied to the load path D-S of the transistor device 1 when the transistor device 1 is in the off-state. "Non-linear" in this connection means that the output capacitance decreases as the load path voltage Vds increases. In a superjunction MOSFET, there is a range of the load path voltage Vds within which the output capacitance decreases for several orders of magnitude as the load path voltage Vds increases. This voltage range may range over several volts. A voltage level at an upper end of this voltage range is referred to as depletion voltage in the following. A significant portion, such as between 80% and 90%, of an overall charge that can be stored in the output capacitance is already stored when the load path voltage Vds reaches the depletion voltage. It may therefore be desirable to design the biasing circuit 3 such that the voltage level of the drain source-voltage Vds generated by the biasing circuit 3 essentially equals the depletion voltage of the transistor device 1. The depletion voltage of the transistor device 1 is explained in detail herein further below.

Referring to the above, the drain-source voltage Vds generated by the biasing circuit 3 is defined by the bias voltage Vbias and the optional at least one inductor 5, 51-56. Referring to the above, when using the at least one inductor 5, 51-56, the bias voltage Vbias can be lower than the drain-source voltage that is desired to be applied to the load path D-S. In particular, when using the at least one inductor 5, 51-56, the bias voltage Vbias can be lower than the depletion voltage of the transistor device 1.

According to one example, the bias voltage Vbias is selected from between 12V and 25V.

Figure 4:
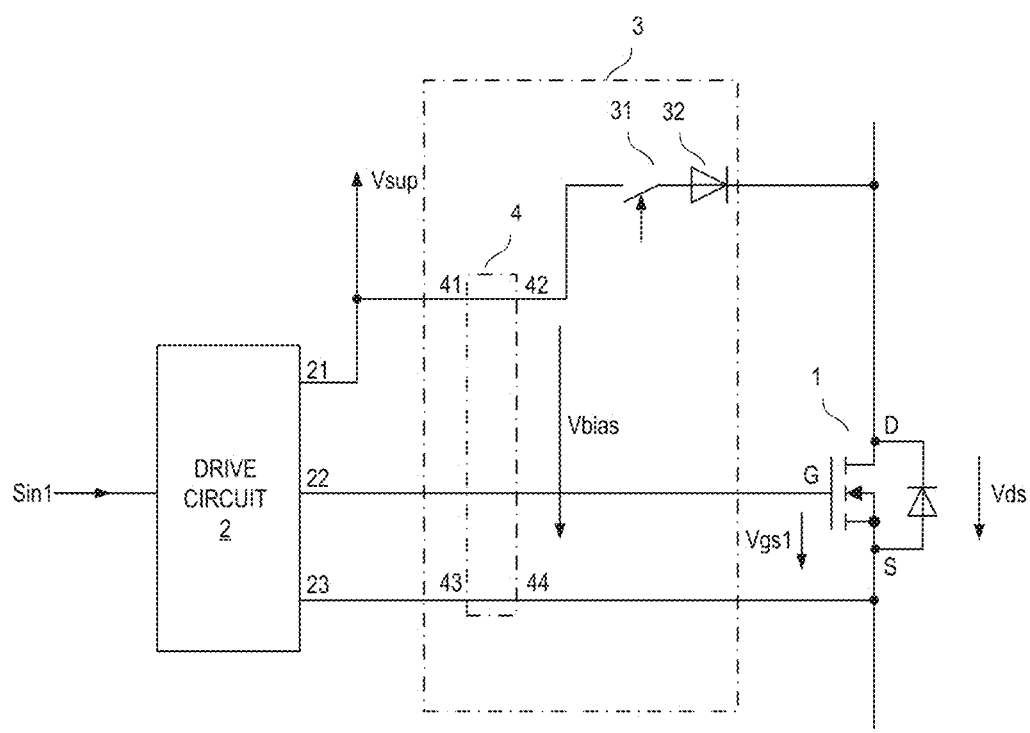
FIG. 4 shows one example of a biasing circuit in which the bias voltage equals the supply voltage.

According to one example, illustrated in FIG. 4, the bias voltage Vbias equals the supply voltage Vsup. In this case, the bias voltage circuit 4 simply includes two connectors that connect the supply voltage Vsup to the biasing circuit 3. According to one example, when the bias voltage Vbias is generated such it essentially equals the supply voltage Vsup, the circuit path with the biasing circuit 3 and the load path D-S includes the at least one inductor 5, 51-56 explained with reference to FIGS. 2 and 3.

According to another example, the bias voltage circuit 4 is configured to generate the bias voltage Vbias based on the supply voltage Vsup such that the bias voltage Vbias is higher than the supply voltage Vsup. One example of a bias voltage circuit 4 that is configured to generate the bias voltage Vbias such that it is higher than the supply voltage Vsup is illustrated in FIG. 5.

The bias voltage circuit 4 illustrated in FIG. 5 is a charge pump circuit that is configured to provide the bias voltage Vbias at an output capacitor 46 connected between output nodes 42, 44 of the bias voltage circuit 4. The charge pump circuit illustrated in FIG. 5 includes an integrated drive circuit 456 that receives the supply voltage Vsup between a first supply input VCC and a second supply input GND. According to one example, this drive circuit 456 is an integrated drive circuit of the type IEDN8511B available from Infineon Technologies AG, Munich.

The drive circuit 456 further includes an output OUT and is configured to either connect the first supply input VCC or the second supply input GND to the output OUT, so that a voltage between the output OUT and the second supply node GN either equals the supply voltage Vsup or is zero. A capacitor 454 connected between the first supply input VCC and the second supply input GND is optional and serves to stabilize the supply voltage received by the drive circuit 456. A second input node 43 and the second output node 44 of the bias voltage circuit are connected and connected to the second supply node of the integrated circuit 456. The supply voltage Vsup and the bias voltage Vbias are therefore referenced to the same circuit node.

The output OUT of the drive circuit 456 is connected to a first circuit node of a charge pump capacitor 453. A second circuit node of the charge pump capacitor 453 is connected to the first input node 41 via a first rectifier element 451. The first rectifier element is a diode, for example. The first rectifier element 451 is connected between the first input node 41 and the second circuit node of the charge pump capacitor 453 such that the first charge pump capacitor 451 can be charged to the supply voltage Vsup via the first rectifier element 451 when the first circuit node of the charge pump capacitor 453 is connected to the second supply node GND via the drive circuit 456.

When the first charge pump capacitor 453 has been charged and the drive circuit 456 connects the output OUT and, therefore, the first circuit node of the charge pump capacitor 453 to the first supply input VCC, the first charge pump capacitor 453 is discharged via a second rectifier element 452, which is connected between the second circuit node of the charge pump capacitor 453 and the output capacitor 46. The drive circuit 456 is configured to periodically connect the output OUT (i) to the second supply node GND, so that the charge pump capacitor 453 is charged, and (ii) the first supply input VCC, so that the charge pump capacitor 453 is discharged and the output capacitor 46 is charged. In this charge pump circuit, the output capacitor 46 (over several periods of the charge pumping process) is charged such that the bias voltage Vbias essentially equals twice the supply voltage Vsup.

The drive circuit 456 further includes a first drive input IN+ that is connected to the first input node 41 of the bias voltage circuit 4, and a second drive input IN− that is connected to the output OUT of the integrated drive circuit 456 via a feedback circuit 455, 457. The feedback circuit 455, 457 includes an RC circuit with a resistor 455 and a capacitor 457, wherein the capacitor is connected between the second drive input IN− and the second supply input GND. In this configuration, the drive circuit 456 is configured to connect the output OUT to the second supply input GND, in order to charge the charge pump capacitor 453, whenever a voltage between the second drive input IN− and the second supply input GND is higher than a predefined first voltage threshold. Further, the drive circuit 456 is configured to connect the first supply input VCC to the output OUT, in order to discharge the charge pump capacitor 453, whenever the voltage at the second drive input IN− is below a predefined second voltage threshold. When the output OUT of the drive circuit 456 is connected to the first supply input VCC, the voltage at the second drive input IN− increases because the capacitor 457 is charged until the voltage reaches the predefined first threshold. When the voltage reaches the predefined threshold, the voltage at the output OUT goes low so that the capacitor 457 is again discharged. In this way, the voltage at the output OUT periodically changes between the supply voltage Vsup and zero, wherein a duration of one period is defined by the RC circuit. A difference between the first and second threshold, which defines a hysteresis of the switching operation, is between 0.5V and 2V, such as between 1V and 1.5V, for example.

Figure 6:
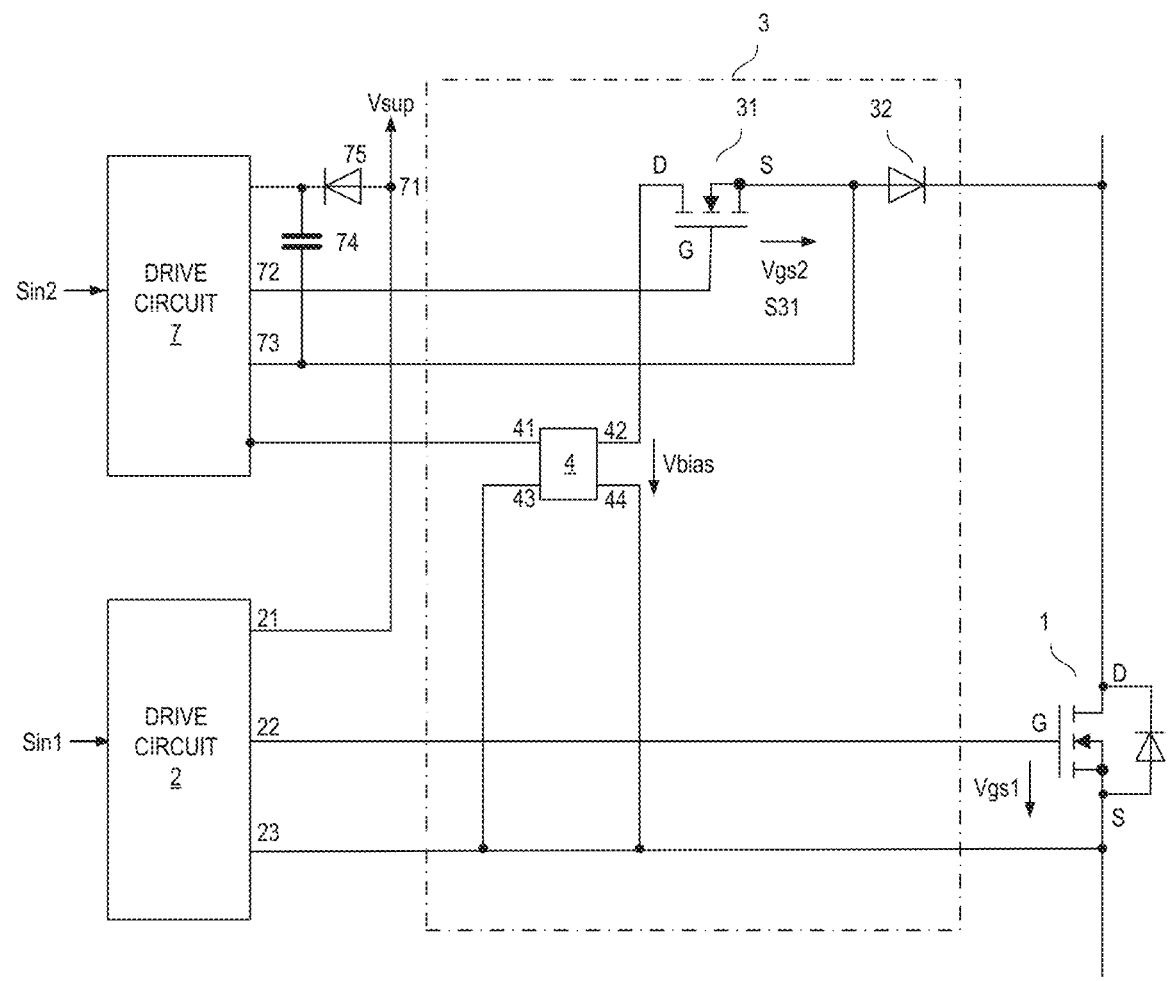
FIG. 6 shows an example of the electronic circuit in which an electronic switch in the biasing circuit is implemented as a further transistor device and in which a drive circuit of the further transistor device receives the same supply voltage as the drive circuit of the transistor device.

FIG. 6 illustrates one example of the electronic circuit in greater detail. It should be noted that the bias voltage circuit 4 may be implemented in accordance with any of the examples explained herein before. Further, the biasing circuit 3 may include at least one inductor. Such inductor, however, is not illustrated in FIG. 6.

In the example illustrated in FIG. 6, the electronic switch 31 of the biasing circuit 3 is implemented as a transistor device. More specifically, in this example, the electronic switch 31 is implemented as a MOSFET, in particular an n-type enhancement MOSFET. This MOSFET includes an integrated body diode (not illustrated). The electronic switch 31 is connected in series with the rectifier element 32 such that the body diode of the MOSFET and the rectifier element 32 are connected in series in a back-to-back configuration.

According to one example, the MOSFET forming the electronic switch 31 is a low voltage MOSFET with a voltage blocking capability that is lower than the voltage blocking capability of the transistor device 1. According to one example, the low voltage MOSFET has a voltage blocking of less than 120V or even less than 100V. The low voltage MOSFET may be implemented as a silicon based non-superjunction device.

Referring to FIG. 6, the electronic circuit further includes a drive circuit 7 that is configured to drive the electronic switch 31 by generating the drive signal S31 received by the electronic switch 31. In this example, the drive signal S31 is a drive voltage Vgs2 received between a gate node G and a source node S of the MOSFET forming the electronic switch 31. In the following, the drive circuit 7 configured to drive the electronic switch 31 is also referred to as second drive circuit, and the drive circuit 2 configured to drive the transistor device 1 is also referred to as first drive circuit 2.

According to one example, the second drive circuit 7 has a first supply input 71 that is connected to the first supply input 21 of the first drive circuit 2, and a second supply input 73 connected to the source node of the MOSFET forming the electronic switch 31. This source node S is connected to the second supply node 23 of the first drive circuit 2 via the diode 32 and the load path of the transistor device 1. In this way, the second drive circuit 7 receives the supply voltage Vsup between the first and second supply node 71, 73 each time the transistor device 1 is in the on-state. The drive circuit 7 may include a bootstrap circuit with a capacitor 74 and a diode 75 connected between the first and second supply nodes 71, 72. In this bootstrap circuit, the capacitor 74 is charged to a voltage level that essentially equals the supply voltage Vsup when the transistor device 1 is in the on-state.

According to one example, the second drive circuit 7 is configured to generate the second drive voltage Vgs2 such that the second drive voltage Vgs2 essentially equals the voltage provided by the bootstrap capacitor 74 when the second input signal Sin2 has a signal level that indicates that it is desired to switch on the electronic switch 31, and is configured to generate the second drive voltage Vgs2 such that the second drive voltage Vgs2 is essentially zero when the second input signal Sin2 has a signal level that indicates that it is desired to switch off the electronic switch 31. According to one example, the second drive voltage Vgs2 is available between an output node 72 and the second supply node 73 of the second drive circuit 7.

Figure 7:
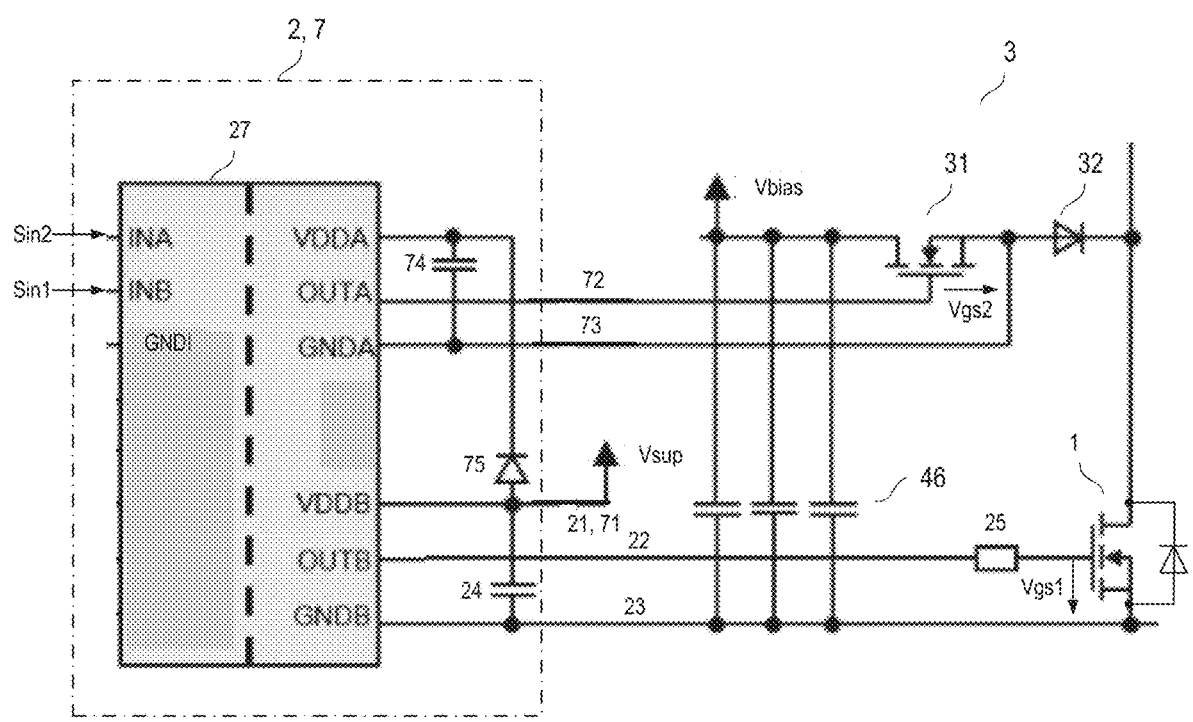
FIG. 7 shows one example of the drive circuit and the further drive circuit in greater detail.

According to one example illustrated in FIG. 7, the first drive circuit 2 and the second drive circuit 7 include a common integrated drive circuit 27 which receives both the first input signal Sin1 and the second input signal Sin2, and which is configured to generate both the first drive voltage Vgs1 received by the transistor device 1, and the second drive voltage Vgs2 received by the electronic circuit 31. In the following, the drive circuit that drives both the transistor device 1 and the electronic switch 31 is referred to as common drive circuit 2, 7 in the following. According to one example, this integrated drive circuit 27 included in the common drive circuit is an integrated circuit of the type 2EDF7275F, available from Infineon Technologies AG, Munich. In this type of integrated drive circuit 27 input nodes INB, INA that receive the first and second input signals Sin1, Sin2 and output nodes OUTB, OUTA at which the first and second drive voltages Vgs1, Vgs2 are available are galvanically isolated from each other.

Referring to FIG. 7, the integrated drive circuit 27 includes a first supply input VDDB and the second supply input GNDB, wherein the supply voltage Vsup is received between these two supply inputs VDDB, GNDB. Optionally, a capacitor 24 that stabilizes the supply voltage received between these supply inputs VDDB, GNDB is connected between these supply inputs VDDB, GNDB. The first drive voltage Vgs1 is available between the first output node OUTB and the second supply node GNDB. Optionally, a resistor 25 is connected between the second output node OUTB and the gate node G of the transistor device 1, wherein this resistor 25 serves to limit a gate current of the transistor device 1.

The integrated drive circuit 27 is configured to generate the first drive voltage Vgs1 such that the first drive voltage Vgs1 essentially equals the supply voltage Vsup when the first input signal Sin1 indicates that it is desired to switch on the transistor device 1. Further, the integrated drive circuit 27 is configured to generate the first drive voltage Vgs1 such that the first drive voltage Vgs1 is essentially zero when the second input signal Sin1 indicates that it is desired to switch off the transistor device 1. According to one example, the first input signal Sin1 is a voltage between the first input node INB and an input reference node GNDI.

Referring to FIG. 7, the integrated drive circuit 27 further includes a third supply input VDDA and the fourth supply input GNDA, wherein the bootstrap capacitor 75 is connected between the third and fourth supply inputs VDDA, VDDB and the bootstrap diode 75 is connected between the third supply input VDDA and the circuit node 21, 71 at which the supply voltage Vsup is available.

The integrated drive circuit 27 is configured to generate the second drive voltage Vgs2 such that a voltage level of the second drive voltage Vgs2 essentially equals the voltage provided by the bootstrap capacitor 74 when the second input signal Sin2 indicates that it is desired to switch on the electronic switch 31. Further, the integrated drive circuit 27 is configured to generate the second drive voltage Vgs2 such that the voltage level of the second drive voltage Vgs2 is essentially zero when the second input signal Sin2 indicates that it is desired to switch off the electronic switch 31. According to one example, the second input signal Sin2 is a voltage between the second input node INA and the reference node GNDI.

The bias voltage circuit 4 is not illustrated in detail in FIG. 7. This bias voltage circuit 4 may be implemented in accordance with any of the examples explained herein before. It should be noted in this regard that an output capacitor 46 which provides the bias voltage Vbias may also be used in a bias voltage circuit 4 of the type shown in FIG. 4, which generates the bias voltage Vbias such that it essentially equals the supply voltage Vsup. The output capacitor 46 may include several sub-capacitors connected in parallel as illustrated in FIG. 7.

Figure 8:
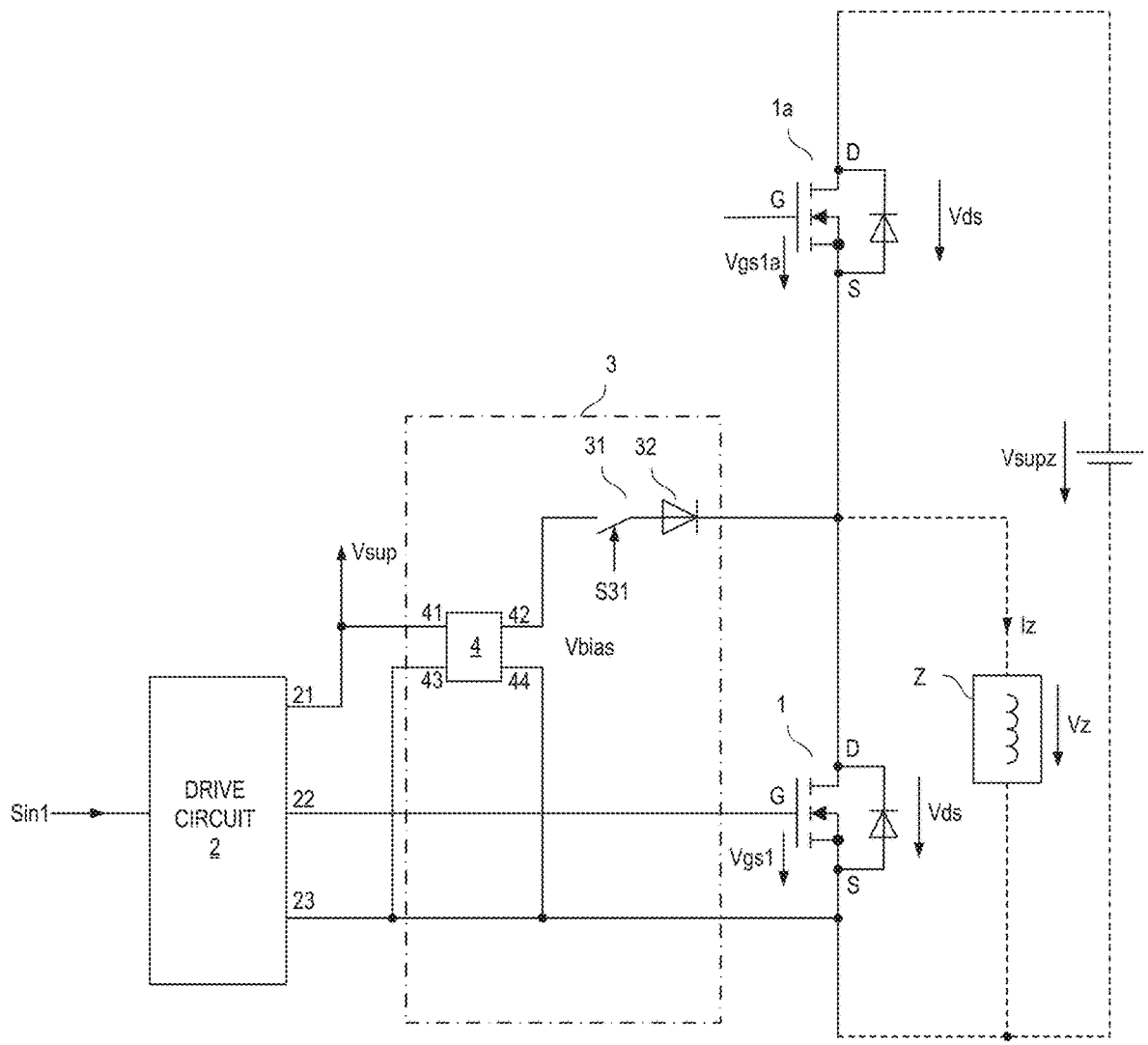
FIG. 8 shows a circuit diagram of an electronic circuit that includes a half-bridge with the transistor device and a further transistor device connected in series with the transistor device.

According to one example illustrated in FIG. 8, the electronic circuit further includes a further transistor device 1a which has a load path D-S connected in series with the transistor device 1. In the following, the transistor device 1 is also referred to as first transistor device 1, and the further transistor device 1a is also referred to as second transistor device 1a. The second transistor device 1a can be a transistor device of the same type as the first transistor device 1 or can be a transistor device of a different type. Just for the purpose of illustration, the circuit symbol of the second transistor device 1a illustrated in FIG. 8 is the circuit symbol of an n-type MOSFET. This, however, is only an example. The second transistor device 1a is not restricted to be implemented as an n-type MOSFET.

The first transistor device 1 and the second transistor device 1a, which have their load paths D-S connected in series, form a half-bridge. One way of operating this half-bridge is explained in the following.

For the purpose of illustration, it is assumed that the half-bridge is connected to a voltage source providing a load supply voltage Vsupz, so that the load supply voltage Vsupz is received by the series circuit including the load paths of the first transistor device 1 and the second transistor device 1a. Further, for the purpose of illustration it is assumed that an inductive load Z is connected in parallel with the load path D-S of the first transistor device 1 and is driven by the half-bridge. This inductive load Z can be any type of inductive load, such as a motor winding, a magnetic valve, an inductor in a switched mode power supply (SMPS), or the like. The inductive load Z includes at least one inductor. In addition to the inductor, the inductive load may include any kind of additional electronic devices.

Figure 9:
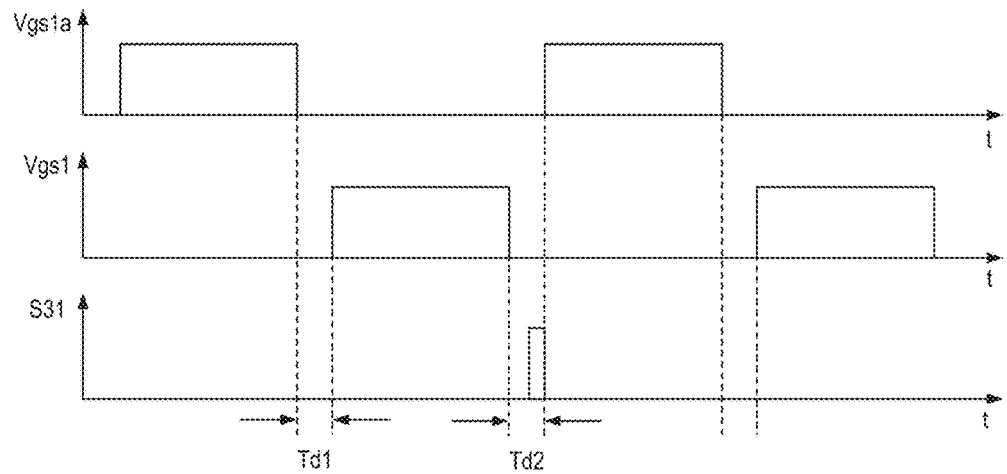
FIG. 9 shows signal diagrams that illustrate operating the electronic circuit according to FIG. 8.

According to one example, the second transistor device 1a is operated in a PWM (pulse-width modulated) fashion. That is, the second transistor device 1a is alternatingly switched on and off. This is illustrated in FIG. 9 which schematically illustrates the drive voltage Vgs1a received by the second transistor device 1a. Just for the purpose of illustration, in FIG. 9, a high signal level of the drive voltage Vgs1a represents a signal level that switches on the second transistor device 1a, and a low signal level of the drive voltage Vgs1a represents a signal level that switches off the second transistor device 1a. When the second transistor device 1a is switched on (is in an on-state), a load voltage Vz, which is a voltage across the inductive load Z, essentially equals the load supply voltage Vsupz. For the purpose of illustration, it is assumed that a load current Iz flows through the inductive load Z when the second transistor device 1a is switched on.

When the second transistor device 1a switches off, the load current Iz continues to flow, forced by the inductive load Z. In this operating state, the first transistor device 1 acts as a freewheeling element that takes over the load current Iz. In order to reduce conduction losses, the first transistor device 1 may be switched on during those time periods in which the second transistor device 1a is switched off. The drive voltage Vgs1 received by the first transistor device 1 is also schematically illustrated in FIG. 9, wherein a high signal level of the drive voltage Vgs1 represents an on-state and a low signal level of the drive voltage Vgs1 represents an off-state of the first transistor device 1.

In order to avoid a cross current, there may be a first dead time Td1 between a time instance at which the second transistor device Vgs1a switches off, and a time instance at which the first transistor device Vgs1 switches on. Further, there may be a second dead time Td2 between a time instance at which the first transistor device 1 switches off and the second transistor device 1a switches on. During those dead times Td1, Td2 the load current Iz flows through the body diode of the first transistor device 1.

In a conventional half-bridge circuit, that is, a half-bridge circuit in which the first transistor device 1 does not have a biasing circuit 3 connected thereto, the load supply voltage Vsupz is applied to the load path D-S of the first transistor device 1 at the end of the second dead time Td2, wherein the load supply voltage Vsupz reverse biases the body diode and charges the output capacitance of the first transistor device 1. Referring to the above, charging the output capacitance is associated with a charging current and, therefore with losses. These losses are dependent on a voltage across a current path in which the charging current flows. In a conventional half-bridge circuit, this current path includes the load paths of the first and second transistor device 1, 1a, and the voltage across this current path is the load supply voltage Vsupz. Dependent on the specific type of application, this load path voltage Vsupz is between 100 V and several 100 V, such as between 200 V and 800 V for example.

The biasing circuit 3 helps to significantly reduce these losses. According to one example, the electronic switch 31 in the biasing circuit 3 is operated such that it switches on during the second dead time Td2. When the electronic switch 31 is switched on, the bias voltage Vbias is applied to the load path D-S of the first transistor device 1, wherein the bias voltage Vbias removes the charge carrier plasma from the first transistor device 1 and charges the output capacitance. According to one example, the bias voltage Vbias (or the voltage generated based on the bias voltage Vbias) is significantly lower than the load supply voltage Vsupz, so that removing the charge carrier plasma and charging the junction capacitance using the biasing circuit 3 is associated with significantly lower losses than in a conventional half-bridge circuit. According to one example, the bias voltage Vbias is less than 10% of the load supply voltage Vsupz.

Voltage blocking capabilities of the first and second transistor device 1, 1a are adapted to the load supply voltage Vsupz, wherein the voltage blocking capability of each of the first and second transistor device 1, 1a at least equals the load supply voltage Vsupz. Thus, according to one example, the bias voltage Vbias is less than 10%, or even less than 7% of a voltage blocking capability of the first transistor device 1.

Figure 10:
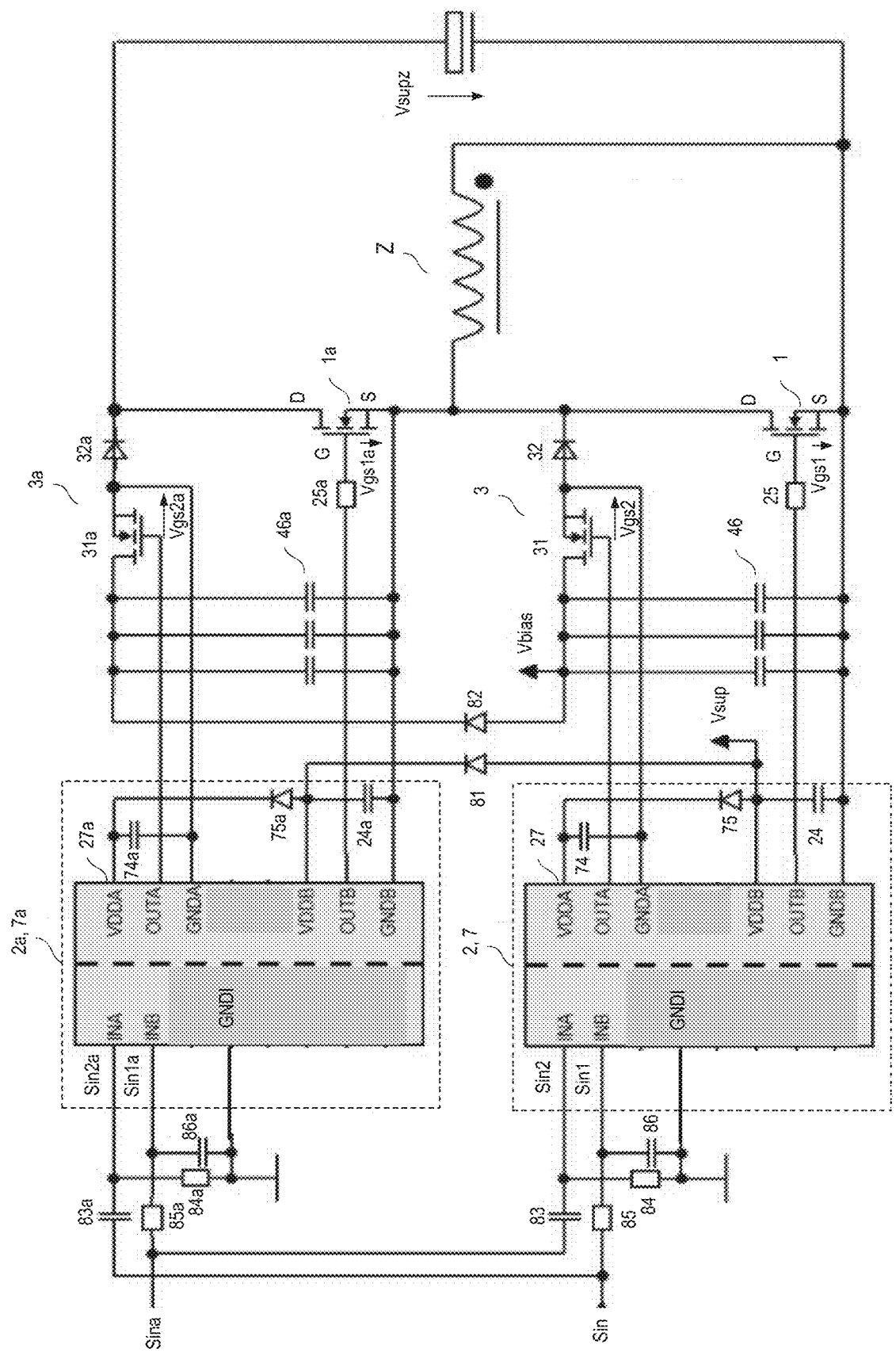
FIG. 10 shows one example of an electronic circuit of the type shown in FIG. 8 in greater detail.

FIG. 10 illustrates one example of a half-bridge circuit of the type shown in FIG. 8, wherein both the first transistor device 1 and the second transistor device 1a have a respective biasing circuit 3, 3a connected thereto. In the following, the biasing circuit 3 connected to the first transistor device 1 is referred to as first biasing circuit, and the biasing circuit 3a connected to the second transistor device 1a is referred to as second biasing circuit in the following. Each of the first and second biasing circuit 3, 3a illustrated in FIG. 10 is implemented in accordance with the examples illustrated in FIGS. 6 and 7. Furthermore, a first common drive circuit 2, 7 for driving the first transistor device 1 and the electronic switch 31 in the first biasing circuit 3 and a second common drive circuit 2a, 7a for driving the second transistor device 1a and the electronic switch 31a in the second biasing circuit 3a are implemented in accordance with the example illustrated in FIG. 7. In FIG. 10, corresponding parts have like reference numbers, wherein lowercase letter "a" has been added to the reference numbers of those circuit parts associated with the second transistor device 1a and the second biasing circuit 3a.

Referring to FIG. 10, both biasing circuits 3, 3a receive the same bias voltage Vbias. This bias voltage Vbias may be generated in accordance with any of the examples explained herein before, wherein the bias voltage circuit 4 is not illustrated in FIG. 10. Referring to FIG. 10, the second biasing circuit 3a may include a bootstrap circuit with a bootstrap diode 82 and at least one capacitor 46a. Via the bootstrap diode 82 the at least one capacitor 46a is charged to the biasing voltage Vbias each time the second transistor device 1a is switched off. In this way, the bias voltage Vbias is available to the second biasing circuit 3a even in those time periods in which the first transistor device is in the off-state.

Equivalently, the second common drive circuit 2a, 7a that drives both the second transistor device 1a and the electronic switch 31a in the second biasing circuit 3a receives the supply voltage Vsup via a bootstrap diode 81.

In the electronic circuit shown in FIG. 10, the first transistor device 1 switches on and off dependent on a first input signal Sin1 received by the integrated drive circuit 27 in the first common drive circuit 2,7, and the electronic switch 31 of the first biasing circuit 3 switches on and off dependent on a second drive signal Sin2 received by the integrated drive circuit 27. This integrated drive circuit 27 is also referred to as first integrated drive circuit in the following.

Equivalently, the second transistor device 1a switches on or off dependent on a third input signal Sin1a received by the integrated drive circuit 27a in the second common drive circuit 2a, 7a, and the electronic switch 31a of the second biasing circuit 3a switches on or off dependent on a fourth input signal Sin2a received by the integrated drive circuit 27a in the second common drive circuit 2a, 7a. This integrated drive circuit 27a is also referred to as second integrated drive circuit in the following.

The input signals Sin1, Sin2, Sin1a, Sin2a received by the first and second integrated drive circuits 27, 27a are dependent on further drive signals Sin, Sina. These signals Sin, Sina may be PWM signals that govern operation of the half-bridge. These signals are therefore referred to as first and second half-bridge signals in the following. The first half-bridge signal Sin governs switching on or off the first transistor device 1 and the electronic switch 31a in the second biasing circuit 3a. That is, the first input signal Sin1 and the fourth input signal Sin2a are generated based on the first half-bridge signal Sin. The second half-bridge signal Sina governs switching on or off the second transistor device 1a and the electronic switch 31 in the first biasing circuit 3. That is, the third input signal Sin1a and the second input signal Sin2 are generated based on the second half-bridge input signal Sina. According to one example, the first and second half-bridge input signals Sin, Sina are complementary signals, so that at most one of these signals Sin, Sina has an on-level at the same time.

Figure 11:
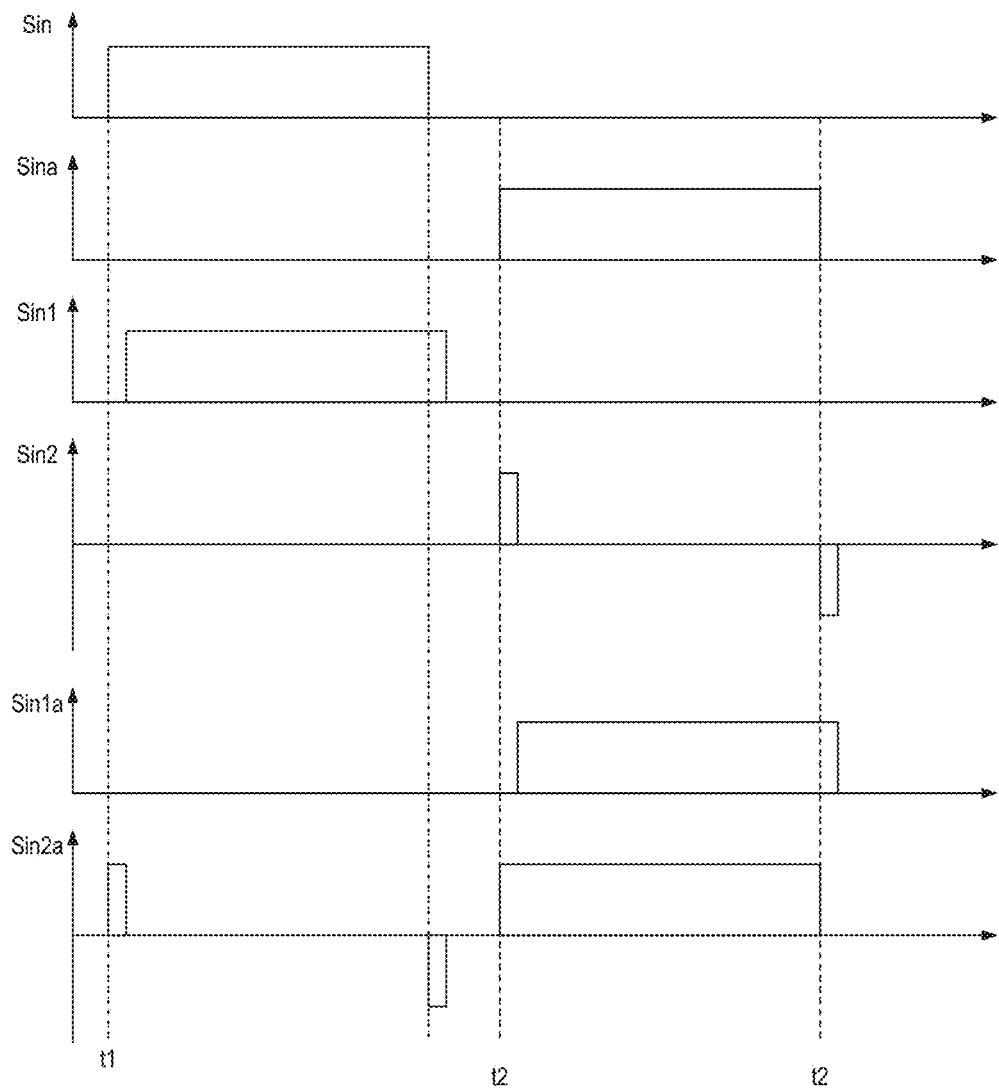
FIG. 11 shows signal diagrams that illustrate operating the electronic circuit according to FIG. 10.

This is illustrated in FIG. 11 which schematically shows signal diagrams of the half-bridge signals Sin, Sina. Just for the purpose of illustration, it is assumed, that a high signal level illustrated in FIG. 11 represents an on-level of the respective input signal and a low signal level represents an off-level of the respective input signal.

According to one example, there is a delay time between a time instance (t1 in FIG. 11) at which the first half-bridge signal Sin changes to an on-level and a time instance at which the first transistor device 1 switches on. According to one example, illustrated in FIG. 10, this delay time is achieved by an RC element including a resistor 85 and a capacitor 86 that receives the first half-bridge input signal Sin and generates the first input signal Sin1. The first input signal Sin1 is a voltage across the capacitor 86 in this example. During this delay time, the electronic switch 31a of the second biasing circuit 3a is switched on for a certain time period, wherein this time period is defined by a further RC element including a further capacitor 83a and further resistor 84a, wherein this RC element receives the first half-bridge signal Sin and generates the fourth input signal Sin2a which governs switching on or off the electronic switch 31a in the second biasing circuit 3a.

Equivalently, there is a delay time between a time instance (t2 in FIG. 11) at which the second half-bridge input signal Sina changes to an on-level and a time instance at which the second transistor device 1a switches on. This delay time is defined by an RC element that includes a resistor 85a and a capacitor 86a, wherein this RC elements receives the second half-bridge input signal Sina and generates the third input signal Sin1a that governs switching on or off the second transistor device 1a. Further, during this delay time, the electronic switch 31 of the first biasing circuit 3 is switched on for a certain time period, wherein this time period is defined by another RC element with a capacitor 83 and a resistor 84, wherein this RC element receives the second half-bridge input signal Sina and generates the second input signal Sin2.

Summarizing the above, in the half-bridge circuit shown in FIG. 11, the electronic switch 31 in the first biasing circuit 3 is switched on for a certain time period before the second transistor device 1a switches on, and the electronic switch 31a in the second biasing circuit 3 is switched on for a certain time period before the first transistor device 1 is switched on. It should be noted that the drive signals Sin1, Sin1a that govern switching on or off the first and second transistor device 1, 1a and the drive signals Sin2, Sin2a that govern switching on or off the electronic switches 31, 31a are only schematically illustrated in FIG. 11. Due to the nature of the RC elements the real wave form of these signals is different from the idealistic rectangular wave forms illustrated in FIG. 11.

Figure 12:
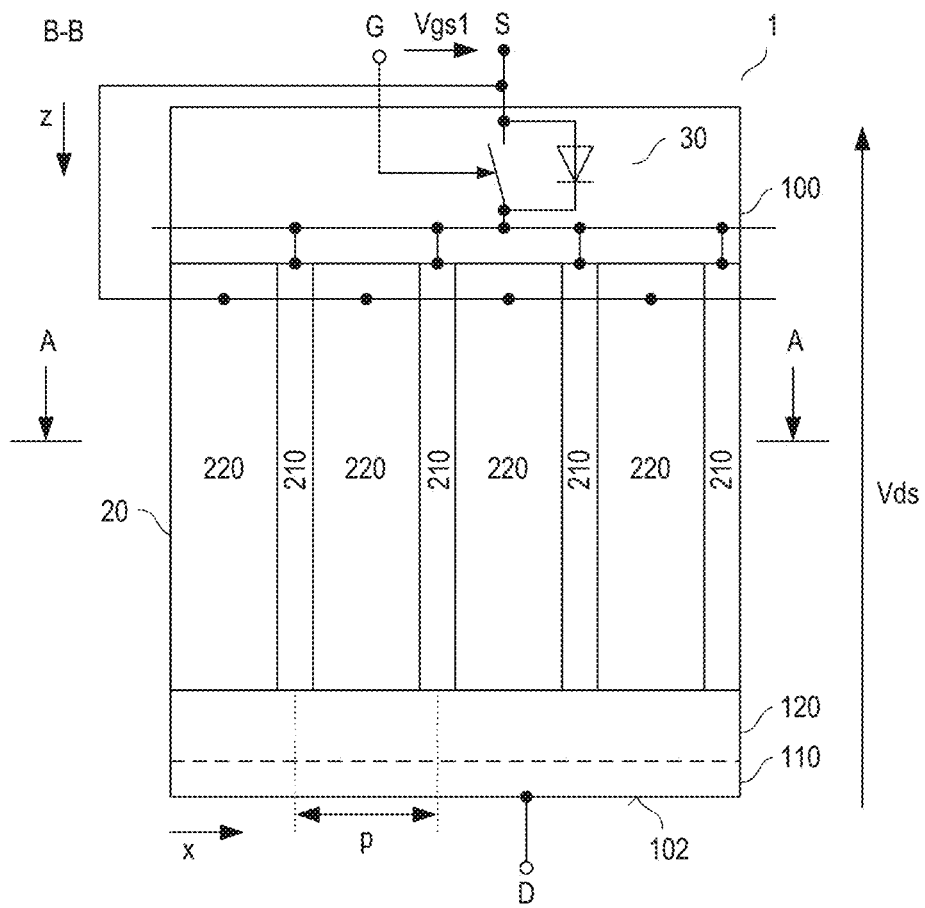
FIG. 12 shows a vertical cross-sectional view of a superjunction transistor device according to one example.

FIG. 12 schematically illustrates one example of the first transistor device 1. More specifically, FIG. 12 illustrates a vertical cross-sectional view of one section of a semiconductor body 100 in which the first transistor device 1 is integrated. The semiconductor body 100 may include a conventional semiconductor material such as, for example, silicon (Si) or silicon carbide (SiC).

The first transistor device illustrated in FIG. 12 is a superjunction transistor device. It should be noted that the first transistor device is not restricted to be implemented in accordance with the example illustrated in FIG. 12. However, FIG. 12 may help to better understand the operating principle of the first transistor device and, in particular, charging the output capacitance of the first transistor device 1 when the transistor device is in the off-state and forward biased so that the output capacitance is charged.

Referring to FIG. 12, in the semiconductor body 100, the first transistor device 1 includes a drift region 20 with a plurality of first regions 210 of a first doping type (conductivity type) and a plurality of second regions 220 of a second doping type (conductivity type) complementary to the first doping type. The first regions 210 and the second regions 220 are arranged alternately in at least one horizontal direction x of the semiconductor body 100, and a pn-junction is formed between each first region 210 and a corresponding adjoining second region 220. A pitch p of the semiconductor structure with the first and second semiconductor regions 210, 220 is given by a center distance between two neighboring first semiconductor regions 210 or a center distance between two neighboring second semiconductor regions 220.

Referring to FIG. 12, the first regions 210 are connected to the drain node D of the transistor device 1, and the second regions 220 are connected to the source node S of the transistor device 1. A connection between the second regions 220 and the source node S is only schematically illustrated in FIG. 12. Examples of how these connections can be implemented are explained with reference to examples herein further below. The first regions 210 are connected to the drain node D via a drain region 110 of the first doping type. The drain region 110 may adjoin the first regions 210. This, however, is not shown in FIG. 12. Optionally, as shown in FIG. 12, a buffer region 120 of the first doping type is arranged between the drain region 110 and the first regions 210. The buffer region 120 has the first doping type, which is the doping type of the drift regions 210 and the drain region 110. According to one example, a doping concentration of the buffer region 120 is lower than a doping concentration of the drain region 110. The doping concentration of the drain region 110 is selected from a range of between 1E17 (=$10^{17}$) cm$^{-3}$ and 1E20 cm$^{-3}$, for example, and the doping concentration of the buffer region 120 is selected from a range of between 1E14 cm$^{-3}$ and 1E17 cm$^{-3}$, for example.

Referring to FIG. 12, the first transistor device 1 further includes a control structure 30 connected between the source node S and the first regions 210. The control structure 30 is at least partially integrated in the semiconductor body 100. Examples of how the control structure 1 may be implemented are explained with reference to examples herein further below. The control structure 30 furthermore includes the gate node G and is configured to control a conducting channel between the source node S and the first regions 210 dependent on the first drive voltage Vgs1 received between the gate node G and the source node S. In the example shown in FIG. 12, this function of the control structure 1 is represented by a switch connected between the source node S and the first regions 210. Furthermore, the control structure 30 includes a pn-junction between the first regions 210 and the source node S. In the example shown in FIG. 12, this pn-junction is represented by a bipolar diode connected between the first regions 210 and the source node S. This diode represents the body diode or is part of the body diode of the transistor device 1.

The transistor device has a current flow direction, which is a direction in which a current may flow between the source node S and the drain node D inside the semiconductor body. In the example shown in FIG. 12, the current flow direction is a vertical direction z of the semiconductor body 100. The vertical direction z is a direction perpendicular to a first surface (not shown in FIG. 12) and a second surface 102, which is formed by the drain region 110, of the semiconductor body 100. FIG. 12 shows a vertical cross-sectional view of the drift region 20, the drain region 110, and the optional buffer region 120. The "vertical cross-sectional view" is a sectional view in a section plane perpendicular to the first surface and the second surface 102 and parallel to the vertical direction z. Section planes perpendicular to the vertical section plane shown in FIG. 12 are referred to as horizontal section planes in the following.

Figure 13:
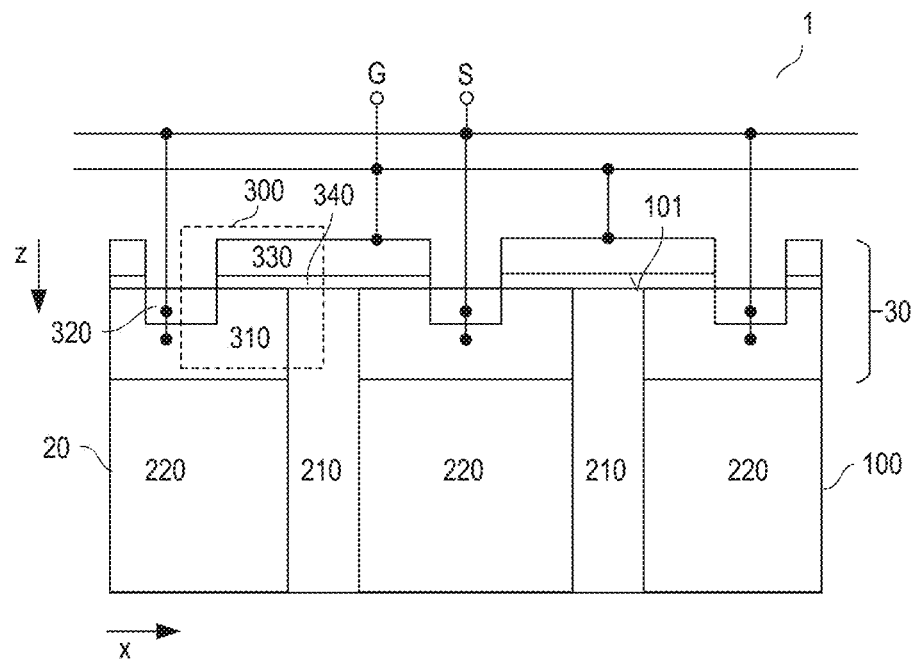
FIG. 13 illustrates one example of a control structure of a transistor device according to FIG. 12.

FIG. 13 shows one example of the control structure 30 in a greater detail. Besides the control structure 30, portions of the drift region 20 adjoining the control structure 30 are shown in FIG. 13. In the example shown in FIG. 13 the control structure 30 includes a plurality of control cells 30, which may also be referred to as transistor cells. Each of these control cells 30 includes a body region 310 of the second doping type, a source region 320 of the first doping type, a gate electrode 330, and a gate dielectric 340. The gate dielectric 340 dielectrically insulates that gate electrode 330 from the body region 310. The body region 310 of each control cell 30 separates the respective source region 320 of the control cell 30 from at least one of the plurality of first regions 210. The source region 320 and the body region 310 of each of the plurality of control cells 30 is electrically connected to the source node S. "Electrically connected" in this context means ohmically connected. That is, there is no rectifying junction between the source node S and the source region 320 and the body region 310. Electrical connections between the source node S and the source region 320 and the body region 310 of the individual control cells 30 are only schematically illustrated in FIG. 13. The gate electrode 330 of each control cell 30 is electrically connected to the gate node G.

Referring to the above, the body region 310 of each control cell 30 adjoins at least one first region 210. As the body region 310 is of the second doping type and the first region 210 is of the first doping type there is a pn-junction between the body region 310 of each control cell 30 and the at least one first region 210. These pn-junctions form the pn-junction of the control structure 30 that is represented by the bipolar diode in the equivalent circuit diagram of the control structure 30 shown in FIG. 12.

In the example shown in FIG. 13, the gate electrode 330 of each control structure 300 is a planar electrode arranged on top of the first surface 101 of the semiconductor body 100 and dielectrically insulated from the semiconductor body 100 by the gate dielectric 340. In this example, sections of the first regions 210, adjacent the individual body regions 310, extend to the first surface 101.

Figure 14:
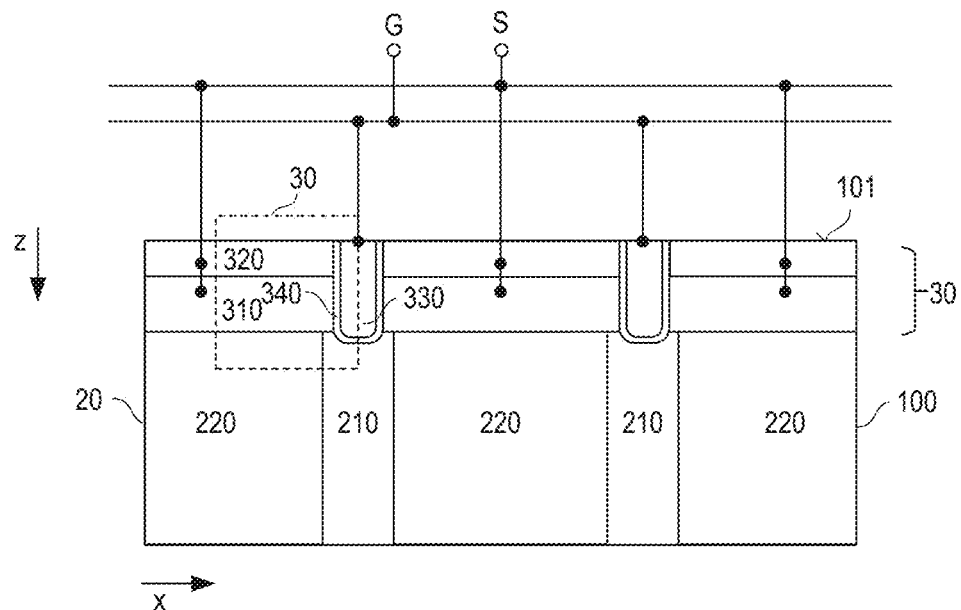
FIG. 14 illustrates another example of a control structure of a transistor device according to FIG. 12.

FIG. 14 shows a control structure 30 according to another example. The control structure 30 shown in FIG. 14 is different from the control structure 30 shown in FIG. 13 in that the gate electrode 330 of each control cell 30 is a trench electrode. This gate electrode 330 is arranged in a trench that extends from the first surface 101 into the semiconductor body 100. Like in the example shown in FIG. 13, a gate dielectric 340 dielectrically insulates the gate electrode 330 from the respective body region 310. The body region 310 and the source region 320 of each control cell 30 are electrically connected to the source node S. Further, the body region 310 adjoins at least one first region 210 and forms a pn-junction with the respective first region 210.

In the examples shown in FIGS. 13 and 14, the control structures 30 each include one gate electrode 330, wherein the gate electrode 330 of each control cell 30 is configured to control a conducting channel between the source region 320 of the respective control cell 30 and one first region 210, so that each control cell 30 is associated with one first region 210. Further, as shown in FIGS. 13 and 14, the body region 310 of each control cell 30 adjoins at least one second region 220, so that the at least one second region 220 is electrically connected to the source node S via the body region 310 of the control cell 30. Just for the purpose of illustration, in the examples shown in FIGS. 2 and 3, the body region 310 of each control cell 30 adjoins one second region 220 so that each control cell 30 is associated with one second region. Furthermore, in the examples, shown in FIGS. 2 and 3, the source regions 320 of two (or more) neighboring control cells 30 are formed by one doped region of the first doping type, the body regions 310 of two (or more) neighboring control cells 30 are formed by one doped region of the second doping type, and the gate electrodes 330 of two (or more) control cells 30 are formed by one electrode. The gate electrodes 330 may include doped polysilicon, a metal, or the like. According to one example, a doping concentration of the source regions 320 is selected from a range of between 1E18 cm$^{-3}$ and 1E210 cm$^{-3}$, and a doping concentration of the body regions 310 is selected from a range of between 1E16 cm$^{-3}$ and 5E18 cm$^{-3}$.

Figure 15:
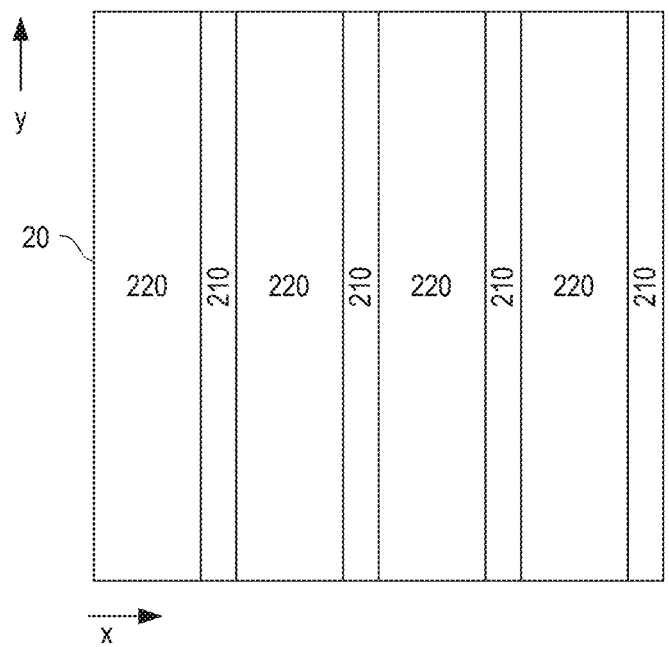
FIG. 15 shows a horizontal cross-sectional view of a superjunction transistor device of the type shown in FIG. 13 according to one example.
Figure 16:
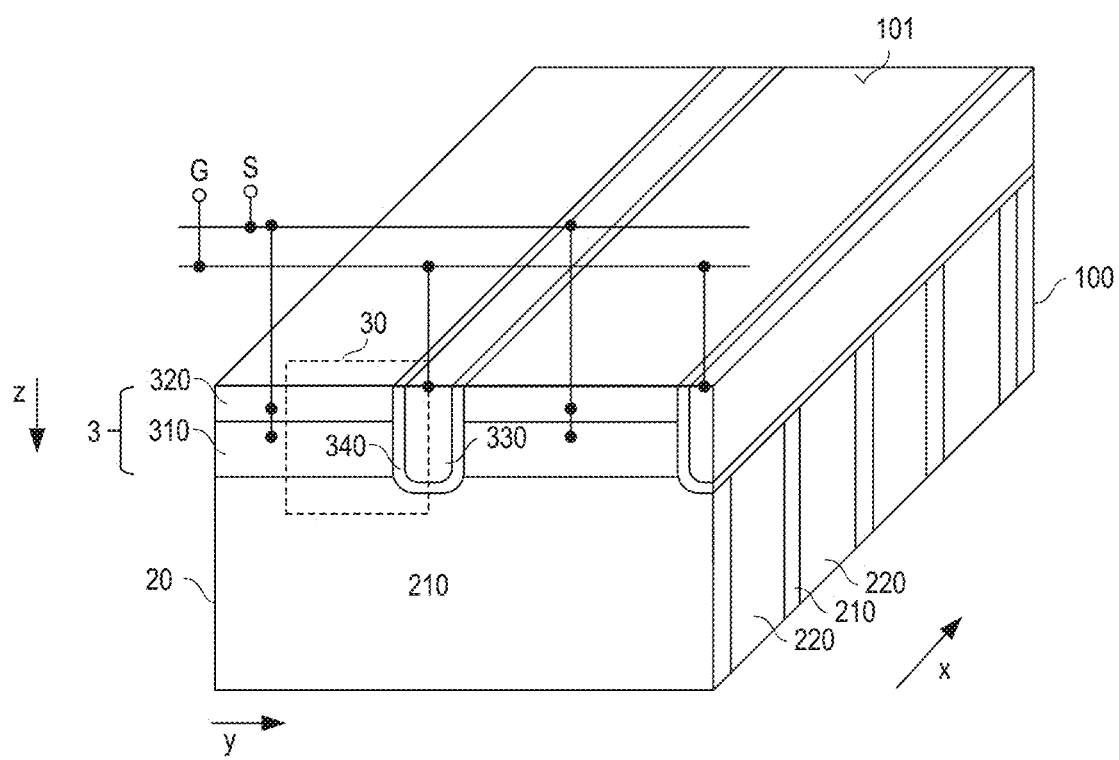
FIG. 16 shows a perspective view of one section of a superjunction transistor device according to another example.

FIG. 16 shows a perspective sectional view of the drift region 20 according to one example. In this example, the first regions 210 and the second regions 220 are elongated in one lateral direction of the semiconductor body 100. Just for the purpose of illustration, this lateral direction is a second lateral direction y perpendicular to the first lateral direction x. "Elongated" means that a length of the first and second regions 210, 220 is significantly greater than a width. The "length" is a dimension in one direction, which may be referred to as longitudinal direction, and the "width" is a dimension in a direction perpendicular to the longitudinal direction. In the example shown in FIG. 15, the length is the dimension in the second lateral direction y of the semiconductor body 100, and the width is the dimension in the first lateral direction x of the semiconductor body 100. According to one example, "significantly greater" means that a ratio between the length and the width is greater than 10, greater than 100, or even greater than 1000.

Associating one control cell 30 of the plurality of control cells with one first region 210 and one second region 220, as illustrated in FIGS. 2 and 3, is only an example. The implementation and the arrangement of the control cells 30 of the control structure 30 are widely independent of the specific implementation and arrangement of the first regions 210 and the second regions 220.

One example illustrating that the implementation and arrangement of the control structure 30 are widely independent of the implementation and arrangement of the first and second regions 210, 220 is shown in FIG. 16. In this example, the first regions 210 and the second regions 220 are elongated in the second lateral direction y of the semiconductor body 100, while the source regions 320, the body regions 310, and the gate electrodes 330 of the individual control cells 30 of the control structure 30 are elongated in the first lateral direction x perpendicular to the second lateral direction y. In this example, the body region 310 of one control cell 30 adjoins a plurality of first regions 210 and second regions 220.

The functionality of a transistor device of the type explained herein above is explained below. The transistor device can be operated in a forward biased state and a reverse biased state. Whether the device is in the forward biased state or the reverse biased state is dependent on a polarity of the load path voltage (drain-source voltage) Vds. In the reverse biased state the polarity of the drain-source voltage Vds is such that the pn-junctions between the body regions 310 and the first regions 210 of the drift region 20 are forward biased, so that in this operation state the transistor device conducts a current independent of an operation state of the control structure 30. In this operating state, that is, when the transistor device is reverse biased, the body diode is forward biased.

In the forward biased state of the transistor device, the polarity of the drain-source voltage Vds such that the pn-junctions between the body regions 310 and the first regions 210 are reverse biased. In this forward biased state, the transistor device can be operated in an on-state or an off-state by the control structure 30. In the on-state, the control structure 30 generates a conducting channel between the source node S and the first regions 210, and in the off-state this conducting channel is interrupted. More specifically, referring to FIGS. 13 and 14, in the on-state there are conducting channels in the body regions 310 between the source regions 320 and the first regions 210 controlled by the gate electrodes 330. In the off-state, these conducting channels are interrupted. The gate electrodes 330 are controlled by a gate-source voltage $V_{GS}$, which is a voltage between the gate node G and the source node S.

The transistor device can be implemented as an n-type transistor device or as a p-type transistor device. In an n-type transistor device, the first doping type, which is the doping type of the first regions 210, the source regions 320, the drain region 110 and the optional buffer region 120 is an n-type and the second doping type, which is the doping type of the second regions 220 and the body regions 310, is a p-type. In a p-type transistor device, the doping types of the device regions mentioned before are complementary to the doping types of the respective device regions in an n-type transistor device. An n-type transistor device, for example, is in the forward biased state when the drain-source voltage Vds is a positive voltage. Furthermore, an n-type enhancement (normally-off) transistor device is in the on-state when the drive voltage (gate-source voltage) Vgs1 is positive and higher than a threshold voltage of the transistor device 1.

Referring to FIGS. 12-14, and 16, in the transistor device 1, the second regions 220 are coupled to the source node S. These second regions 220, which are sometimes referred to as compensation regions, may directly by connected to the source node S (not illustrated), or may be connected to the source node S via the body regions 310) as illustrated. In this case, each of the second regions 220 adjoins at least one of the body regions 310, wherein the body regions 310 are connected to the source node S (as schematically illustrated in FIGS. 12-14, and 16). Between the first regions 210 and the second regions 220 pn-junctions are formed. Thus, the first and second regions 210, 220 form a junction capacitance, wherein this junction capacitance forms a significant portion of the output capacitance of the transistor device 1. When the transistor device is in the off-state and forward biased the pn-junctions between the first and second regions 210, 220 are reverse biased, so that depletion regions (space charge regions) expand in the first and second regions. This is equivalent to charging the junction capacitance formed by the first and second regions 210, 220.

Figure 17:
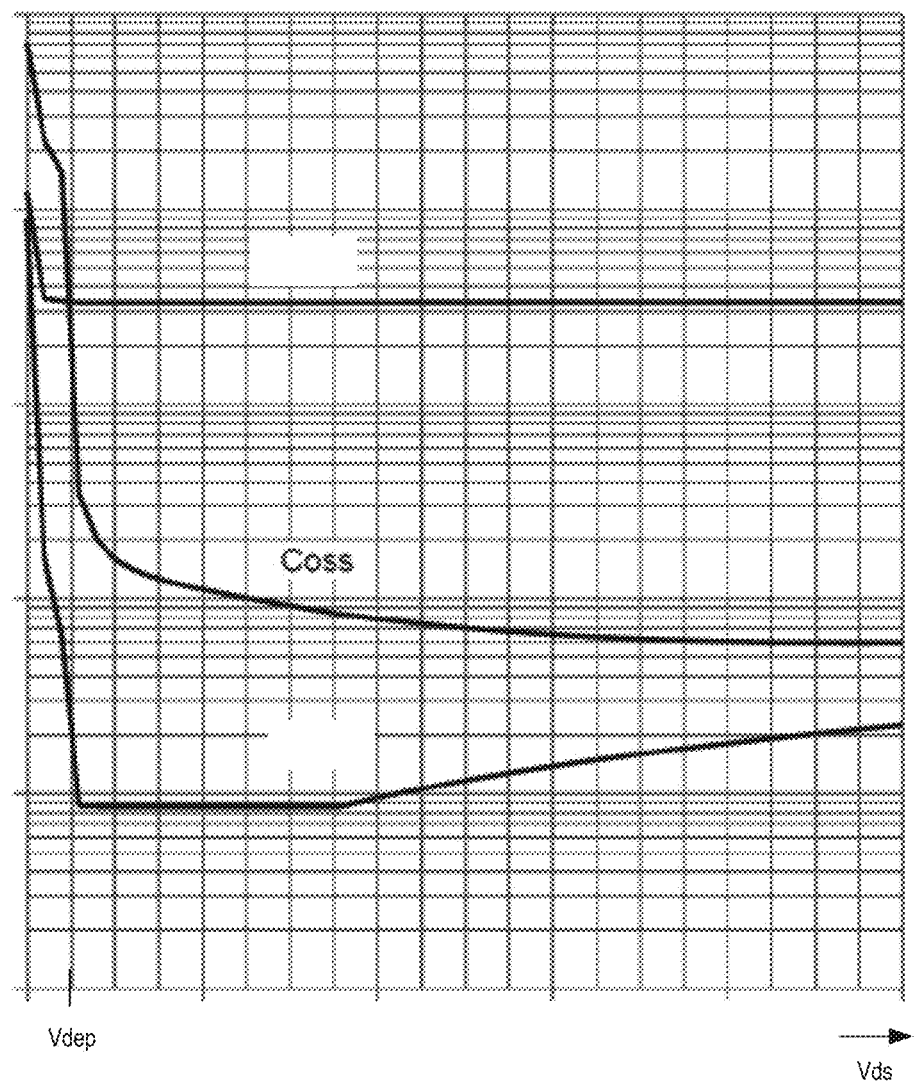
FIG. 17 illustrates the dependency of an output capacitance of a superjunction transistor device on a load path voltage (drain-source voltage) of the superjunction transistor device.

FIG. 17 illustrates one example of an output capacitance Coss of a superjunction transistor device on a logarithmic scale. As can be seen from FIG. 17, the output capacitance is highly dependent on the drain-source voltage Vds (which is also illustrated on a logarithmic scale) in such a way that the output capacitance Coss decreases as the drain-source voltage Vds increases. More specifically, the output capacitance Coss rapidly decreases when the drain-source voltage Vds reaches a certain voltage level Vdep, which is referred to as depletion voltage in the following. The output capacitance Coss may decrease for about 2 orders of magnitude, or more, when the drain-source voltage Vds reaches the depletion voltage Vdep.

In the superjunction transistor device, the first and second regions 210, 220 are implemented such that they can completely be depleted of charge carriers, when the pn junctions between the first and second regions 210, 220 are reverse biased. A doping concentrations of the first and second regions 210, 220 is between $1E15$ $cm^{-3}$ and $1E17$ $cm^{-3}$, for example, and the pitch p is such that the voltages across these pn junctions are below the breakdown voltage when the first and second regions 210, 220 are completely depleted. The depletion voltage Vdep is the voltage level of the drain-source voltage Vds that is required to completely deplete the first and second regions 210, 220. This depletion voltage Vdep is much lower than the voltage blocking capability of the transistor device. The superjunction transistor 1 can be implemented such that depletion voltage Vdep is less than 30V, or even less than 25V, while the voltage blocking capability is several 100 volts (V), such as 600V or 800V.

When the drain-source voltage Vds has reached the depletion voltage Vdep the output capacitance Coss has been mainly charged. That is, for example, between 80% and 90% of an overall charge that can be stored in the output capacitance Coss have been stored when the drain source voltage Vds reaches the depletion voltage Vdep. Thus, according to one example, in the electronic circuit explained before, the voltage applied by the biasing circuit 3 to the load path of the transistor device 1 is at least 50%, at least 80% or at least 90% of the depletion voltage Vdep. This "voltage applied to the load path of the transistor device 1" is either the bias voltage Vbias or the boosted bias voltage (when the at least one inductor is used). According to one example, the bias voltage is between 50% and 100% of the depletion voltage Vdep.

In a superjunction transistor device, the depletion voltage Vdep decrease as the pitch p decreases, wherein the lower the depletion voltage Vdep, the lower the bias voltage that is required. According to one example, the superjunction transistor device 1 is implemented such that the pitch p is lower than 7.5 micrometers (µm), lower than 5.5 µm, or even lower than 4.5 µm. The pitch of the transistor device may vary. Thus, according to one example, pitch p as used herein denotes the average pitch.

Although the present disclosure is not so limited, the following numbered examples demonstrate one or more aspects of the disclosure.

Example 1—An electronic circuit, including: a transistor device comprising a load path and a drive input; a first drive circuit configured to receive a supply voltage and generate a drive signal for the transistor device based on the supply voltage; and a biasing circuit connected in parallel with the load path of the transistor device, wherein the biasing circuit comprises a bias voltage circuit configured to receive the supply voltage and generate a bias voltage higher than the supply voltage based on the supply voltage.

Example 2—The electronic circuit of example 1, wherein the bias voltage is between 1.2 times and 2.5 times the supply voltage, in particular, between 1.5 times and 2 times the supply voltage.

Example 3—The electronic circuit of example 1 or 2, wherein the bias voltage is between 20V and 25V.

Example 4—The electronic circuit of any one of the preceding examples, wherein the supply voltage is between 10V and 15V, in particular between 11V and 13V.

Example 5—The electronic circuit of any one of the preceding examples, wherein the bias voltage circuit comprises a voltage doubler circuit.

Example 6—The electronic circuit of any one of the preceding examples, further including at least one inductor in the biasing circuit.

Example 7—The electronic circuit of example 6, wherein an inductance provided by the at least one inductor is between 5 nanohenries and 30 nanohenries, in particular between 10 nanohenries and 20 nanohenries.

Example 8—The electronic circuit of any one of the preceding examples, wherein the biasing circuit further includes: an electronic switch; and a rectifier element, wherein the bias voltage circuit, the electronic switch, and the rectifier element are connected in series.

Example 9—The electronic circuit of example 8, wherein the transistor device is a silicon-based transistor device, and wherein the rectifier element comprises a silicon-carbide based diode.

Example 10—The electronic circuit of example 8 or 9, wherein the electronic switch comprises a further transistor device.

Example 11—The electronic circuit of example 10, wherein the further transistor device is a MOSFET.

Example 12—The electronic circuit of example 11, wherein the MOSFET has a voltage blocking capability of less than 120V or less than 100V.

Example 13—The electronic circuit of any one of examples 10 to 12, further including: a second drive circuit configured to receive the supply voltage and generate a drive signal for the further transistor device based on the supply voltage.

Example 14—The electronic circuit of any one of the preceding examples, wherein the transistor device is a superjunction transistor device.

Example 15—The electronic circuit of example 14, wherein the transistor device has a depletion voltage, and wherein the bias voltage is at least 80% of the depletion voltage.

Example 16—The electronic circuit of any one of the preceding examples, wherein the transistor device is a first transistor device and wherein the biasing circuit is a first biasing circuit, and wherein the electronic circuit further comprises: a second transistor device having a load path connected in series with the first transistor device; a second biasing circuit connected in parallel with the load path of the second transistor device, wherein the second biasing circuit is configured to receive the bias voltage from the first biasing circuit.

Example 17—An electronic circuit, comprising: a transistor device comprising a load path and a drive input; a biasing circuit connected in parallel with the load path of the transistor device, wherein the biasing circuit is configured to connect a bias voltage circuit providing a bias voltage to the load path of the transistor device, and wherein the biasing circuit includes at least one inductor.

Example 18—The electronic circuit of example 17, wherein an inductance provided by the at least one inductor is between 5 nanohenries and 30 nanohenries, in particular between 10 nanohenries and 20 nanohenries.

Example 19—The electronic circuit of example 17 or 18, wherein the at least one inductor comprises at least one discrete inductor in the biasing circuit.

Example 20—The electronic circuit of any one of examples 17 to 19, wherein the at least one inductor is configured to have a boost effect such that a voltage applied to the load-path by the biasing circuit reaches a voltage level which is at least 1.2 times, at least 1.5 times, at least 2 times, or at least 3 times the voltage level of the bias voltage.

Example 21—The electronic circuit of any one of examples 17 to 20, wherein the electronic circuit further comprises a drive circuit configured to receive a supply voltage and generate a drive signal for the transistor device based on the supply voltage, and wherein the bias voltage equals the supply voltage.

Example 22—The electronic circuit of any one of examples 17 to 20, wherein the bias voltage circuit is configured to receive the supply voltage and generate the bias voltage such that it is higher than the supply voltage.

Example 23—The electronic circuit of example 22, wherein the bias voltage is between 1.2 times and 2.5 times the supply voltage, in particular, between 1.5 times and 2 times the supply voltage.

Example 24—The electronic circuit of any one of examples 17 to 23, further comprising: an electronic switch and a rectifier element connected in series with the bias voltage circuit.

Example 25—The electronic circuit of any one of examples 17 to 24, wherein the transistor device is a superjunction transistor device.

Example 26—An electronic circuit, comprising: a superjunction transistor device comprising a drain node and a source node; and a biasing circuit connected between the drain node and the source node of the transistor device and configured to connect a bias voltage circuit between the drain node and the source node, wherein the superjunction transistor device further comprises a drift region with a plurality of first regions of a first doping type and a plurality of second regions of a second doping type complementary to the first doping type, wherein the first regions are connected to the drain node and the second regions are connected to the source node, wherein pn-junctions are formed between the first regions and the second regions, and wherein a pitch of the drift region is smaller than 7.5 µm.

Example 27—The electronic circuit of example 26, wherein the electronic circuit further comprises a drive circuit configured to receive a supply voltage and generate a drive signal for the transistor device based on the supply voltage.

Example 28—The electronic circuit of example 27, wherein the bias voltage equals the supply voltage.

Example 29—The electronic circuit of example 27, wherein the bias voltage circuit is configured to receive the supply voltage and generate the bias voltage such that it is higher than the supply voltage.

Example 30—The electronic circuit of any one of examples 26 to 28, wherein the biasing circuit includes at least one inductor.

What is claimed is:

1. An electronic circuit, comprising:
   a transistor device comprising a load path and a drive input; and
   a biasing circuit connected in parallel with the load path of the transistor device,
   wherein the biasing circuit is configured to connect a bias voltage circuit providing a bias voltage to the load path of the transistor device,
   wherein the biasing circuit includes at least one inductor,
   wherein the transistor device is a superjunction transistor device.

2. The electronic circuit of claim 1, wherein the transistor device comprises:
   a drift region with a plurality of first regions of a first doping type and a plurality of second regions of a second doping type complementary to the first doping type; and
   a control structure connected between a source node of the transistor device and the first regions.

3. The electronic circuit of claim 2, wherein the control structure comprises a gate node of the transistor device and is configured to control a conducting channel between the source node and the first regions dependent on a drive voltage received between the gate node and the source node.

4. The electronic circuit of claim 2, wherein the control structure comprises a pn-junction between the first regions and the source node.

5. The electronic circuit of claim 2, wherein the control structure comprises a plurality of control cells, each control cell comprising a body region of the second doping type, a source region of the first doping type, a gate electrode, and a gate dielectric that dielectrically insulates the gate electrode from the body region.

6. The electronic circuit of claim 5, wherein the body region of each control cell adjoins at least one first region such that there is a pn-junction between the body region of each control cell and the at least one first region.

7. The electronic circuit of claim 5, wherein the gate electrode of each control cell is a planar electrode arranged on top of a first surface of a semiconductor body and dielectrically insulated from the semiconductor body by the gate dielectric.

8. The electronic circuit of claim 5, wherein the gate electrode of each control cell is a trench electrode arranged in a trench that extends from a first surface of a semiconductor body and into the semiconductor body.

9. The electronic circuit of claim 5, wherein the body region of each control cell adjoins at least one second region such that the at least one second region is electrically connected to the source node via the body region of the control cell.

10. The electronic circuit of claim 5, wherein the first regions and the second regions are elongated in a second lateral direction of a semiconductor body, and wherein the source regions, the body regions, and the gate electrodes of the individual control cells of the control structure are elongated in a first lateral direction perpendicular to the second lateral direction.

11. The electronic circuit of claim 5, wherein the body region of one control cell adjoins a plurality of the first regions and a plurality of the second regions.

12. An electronic circuit, comprising:
a superjunction transistor device comprising a drain node and a source node; and
a biasing circuit connected between the drain node and the source node of the transistor device and configured to connect a bias voltage circuit between the drain node and the source node,
wherein the superjunction transistor device further comprises a drift region with a plurality of first regions of a first doping type and a plurality of second regions of a second doping type complementary to the first doping type,
wherein the first regions are connected to the drain node and the second regions are connected to the source node,
wherein pn-junctions are formed between the first regions and the second regions,
wherein a pitch of the drift region is smaller than 7.5 μm, the pitch corresponding to a center distance between two neighboring first regions or a center distance between two neighboring second regions.

13. The electronic circuit of claim 12, further comprising:
a drive circuit configured to receive a supply voltage and generate a drive signal for the transistor device based on the supply voltage.

14. The electronic circuit of claim 13, wherein the bias voltage equals the supply voltage.

15. The electronic circuit of claim 12, wherein the bias voltage circuit is configured to receive the supply voltage and generate the bias voltage such that the bias voltage is higher than the supply voltage.

16. The electronic circuit of claim 12, wherein the biasing circuit includes at least one inductor.

17. The electronic circuit of claim 12, wherein the superjunction transistor device comprises:
a control structure connected between the source node and the first regions.

18. The electronic circuit of claim 17, wherein the control structure comprises a gate node of the superjunction transistor device and is configured to control a conducting channel between the source node and the first regions dependent on a drive voltage received between the gate node and the source node.

19. The electronic circuit of claim 17, wherein the control structure comprises a plurality of control cells, each control cell comprising a body region of the second doping type, a source region of the first doping type, a gate electrode, and a gate dielectric that dielectrically insulates the gate electrode from the body region.

20. The electronic circuit of claim 19, wherein the body region of each control cell adjoins at least one first region such that there is a pn-junction between the body region of each control cell and the at least one first region.

21. The electronic circuit of claim 19, wherein the gate electrode of each control cell is a planar electrode arranged on top of a first surface of a semiconductor body and dielectrically insulated from the semiconductor body by the gate dielectric.

22. The electronic circuit of claim 19, wherein the gate electrode of each control cell is a trench electrode arranged in a trench that extends from a first surface of a semiconductor body and into the semiconductor body.

23. The electronic circuit of claim 19, wherein the body region of each control cell adjoins at least one second region such that the at least one second region is electrically connected to the source node via the body region of the control cell.

24. The electronic circuit of claim 19, wherein the first regions and the second regions are elongated in a second lateral direction of a semiconductor body, and wherein the source regions, the body regions, and the gate electrodes of the individual control cells of the control structure are elongated in a first lateral direction perpendicular to the second lateral direction.

25. The electronic circuit of claim 19, wherein the body region of one control cell adjoins a plurality of the first regions and a plurality of the second regions.

* * * * *